US010141159B2

(12) United States Patent
Doi et al.

(10) Patent No.: US 10,141,159 B2
(45) Date of Patent: Nov. 27, 2018

(54) SAMPLE OBSERVATION DEVICE HAVING A SELECTABLE ACCELERATION VOLTAGE

(71) Applicant: Hitachi High-Technologies Corporation, Minato-ku, Tokyo (JP)

(72) Inventors: Ayumi Doi, Tokyo (JP); Tomohiro Funakoshi, Tokyo (JP); Takuma Yamamoto, Tokyo (JP); Tomohiro Tamori, Tokyo (JP); Tsunehiro Sakai, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/763,363

(22) PCT Filed: Jan. 17, 2014

(86) PCT No.: PCT/JP2014/050770
§ 371 (c)(1),
(2) Date: Jul. 24, 2015

(87) PCT Pub. No.: WO2014/125868
PCT Pub. Date: Aug. 21, 2014

(65) Prior Publication Data
US 2015/0371816 A1 Dec. 24, 2015

(30) Foreign Application Priority Data

Feb. 15, 2013 (JP) .................................. 2013-027894

(51) Int. Cl.
*H01J 37/26* (2006.01)
*H01J 37/28* (2006.01)
*H01J 37/24* (2006.01)

(52) U.S. Cl.
CPC .......... *H01J 37/263* (2013.01); *H01J 37/241* (2013.01); *H01J 37/28* (2013.01); *H01J 2237/225* (2013.01); *H01J 2237/281* (2013.01)

(58) Field of Classification Search
CPC .......... H01J 2237/225; H01J 2237/281; H01J 37/263; H01J 37/28
See application file for complete search history.

(56) References Cited

U.S. PATENT DOCUMENTS 5,412,210 A * 5/1995 Todokoro ............... G01B 15/04
250/306
5,866,904 A * 2/1999 Todokoro ............... G01B 15/00
250/307

(Continued)

FOREIGN PATENT DOCUMENTS

JP 2004-235464 A 8/2004
JP 2010-175249 A 8/2010

OTHER PUBLICATIONS

International Search Report (PCT/ISA/210) dated Feb. 10, 2014, with English translation (two (2) pages).

*Primary Examiner* — Wyatt Stoffa
(74) *Attorney, Agent, or Firm* — Crowell & Moring LLP

(57) ABSTRACT

A sample observation device of the invention includes: a charged particle optical column for irradiating a sample with charged particle beams at a first acceleration voltage, the sample having a target part to be observed which is a concave part; an image acquisition part for acquiring an image including the target part to be observed on the basis of signals obtained by irradiation with the charged particle beams; a memory part for memorizing in advance, at each of a plurality of acceleration voltages, information indicating a relationship between a brightness ratio of a concave part to a periphery part of the concave part in a standard sample and a value indicating a structure of the concave part (Continued)

in the standard sample; and an operation part for obtaining a brightness ratio of the concave part to a periphery part of the concave part in the image. The operation part judges appropriateness/inappropriateness of the first acceleration voltage with the use of the information indicating the relationship and the brightness ratio in the image.

13 Claims, 30 Drawing Sheets

(56) References Cited

U.S. PATENT DOCUMENTS

| | | | | |
|---|---|---|---|---|
| 6,172,365 | B1* | 1/2001 | Hiroi | H01J 37/28 250/307 |
| 7,642,514 | B2* | 1/2010 | Takane | G06T 5/50 250/307 |
| 2001/0033683 | A1* | 10/2001 | Tanaka | G06T 7/001 382/149 |
| 2004/0164244 | A1* | 8/2004 | Hiroi | H01J 37/28 250/310 |
| 2005/0082476 | A1* | 4/2005 | Hiroi | H01J 37/28 250/310 |
| 2006/0071167 | A1* | 4/2006 | Todokoro | H01J 37/026 250/310 |
| 2006/0151700 | A1* | 7/2006 | Honda | G01N 23/2251 250/310 |
| 2009/0152461 | A1* | 6/2009 | Kim | H01J 37/244 250/307 |
| 2010/0136717 | A1* | 6/2010 | Shin | H01J 37/241 438/14 |
| 2011/0012029 | A1* | 1/2011 | Abe | H01J 37/263 250/492.2 |
| 2012/0068065 | A1* | 3/2012 | Mitsui | H01J 37/222 250/307 |
| 2012/0080597 | A1* | 4/2012 | Shin | H01J 37/241 250/310 |
| 2014/0339425 | A1* | 11/2014 | Yano | G01B 15/00 250/307 |
| 2016/0071688 | A1* | 3/2016 | Goto | H01J 37/22 250/440.11 |

* cited by examiner

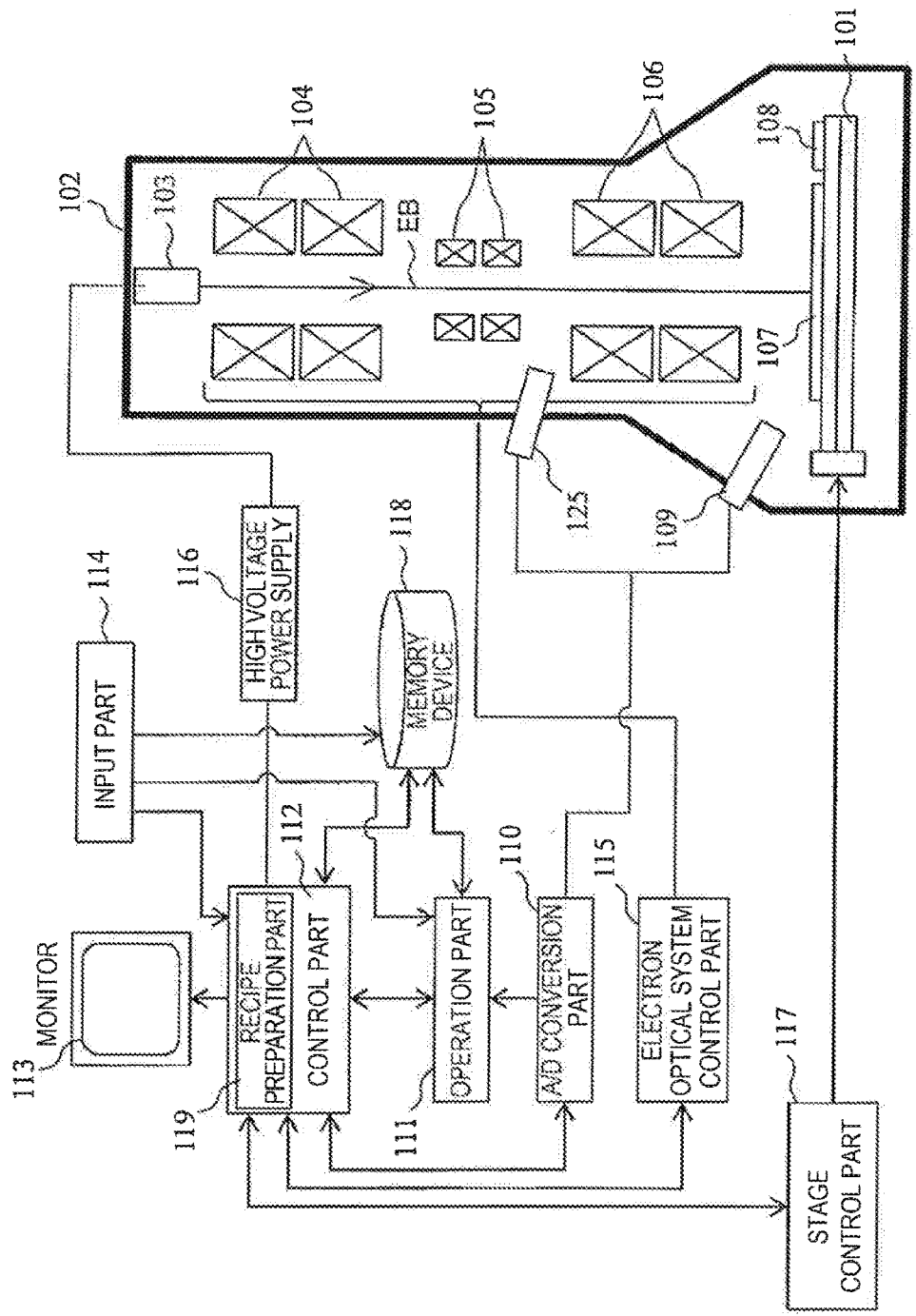
[FIG. 1A]

[FIG. 1B]
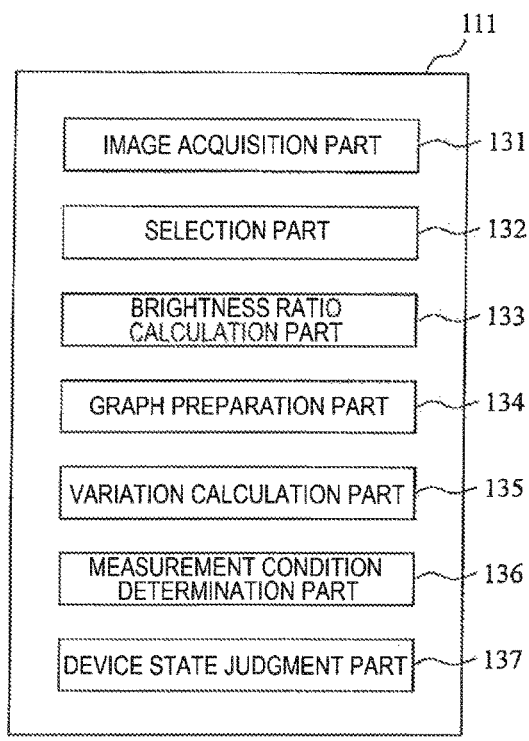
[FIG. 2A]
SAMPLE A (HOLE)
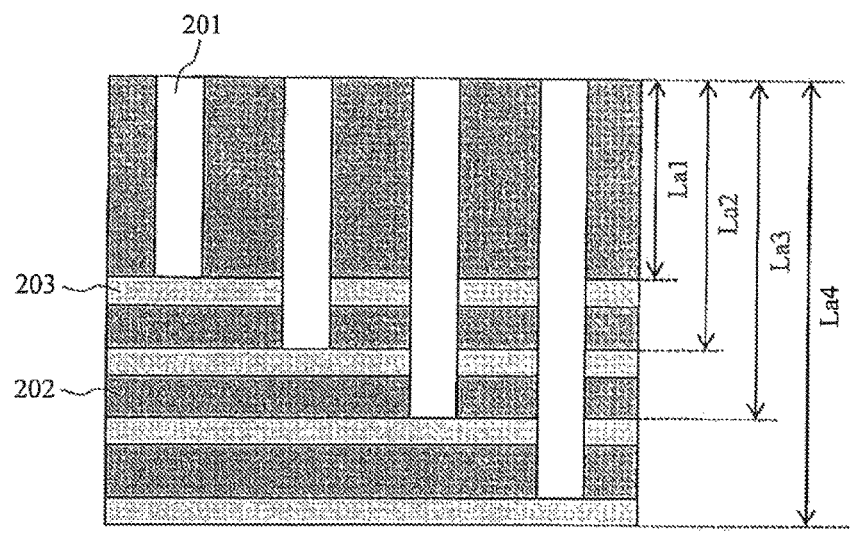

[FIG. 2B]
SAMPLE A (HOLE)
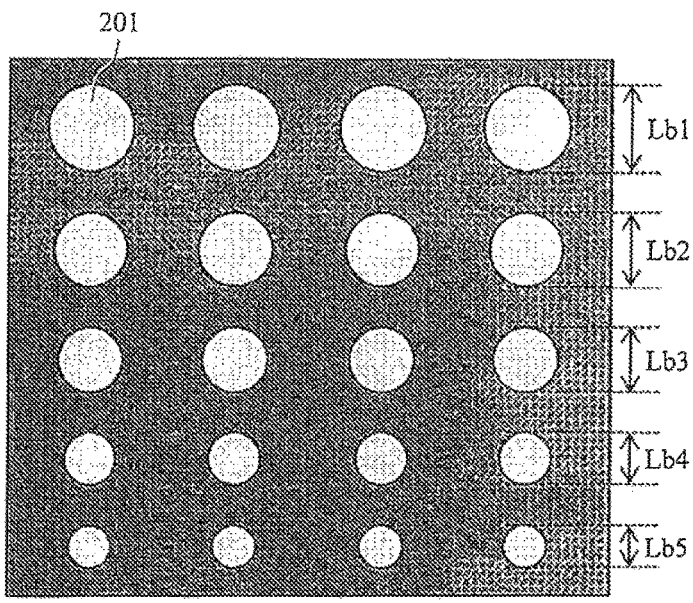
[FIG. 3A]
SAMPLE B (TRENCH)
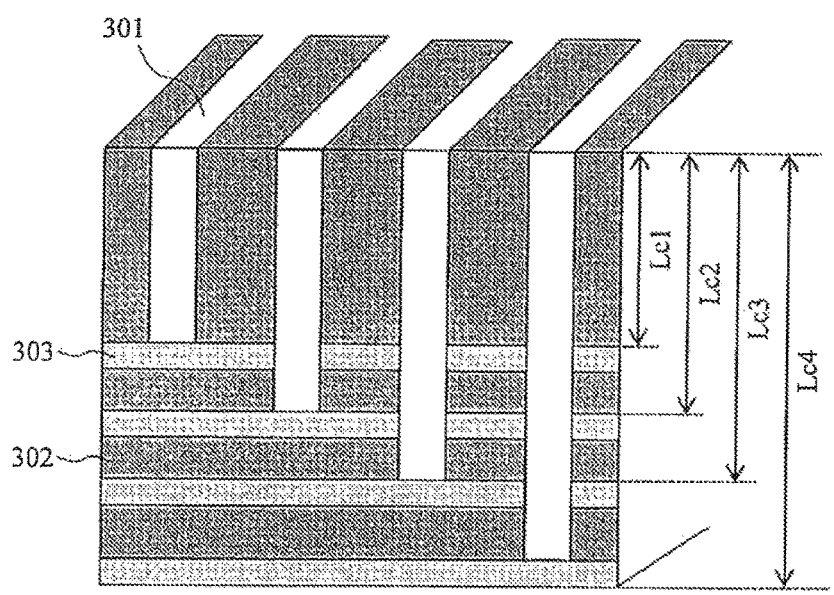

[FIG. 3B]
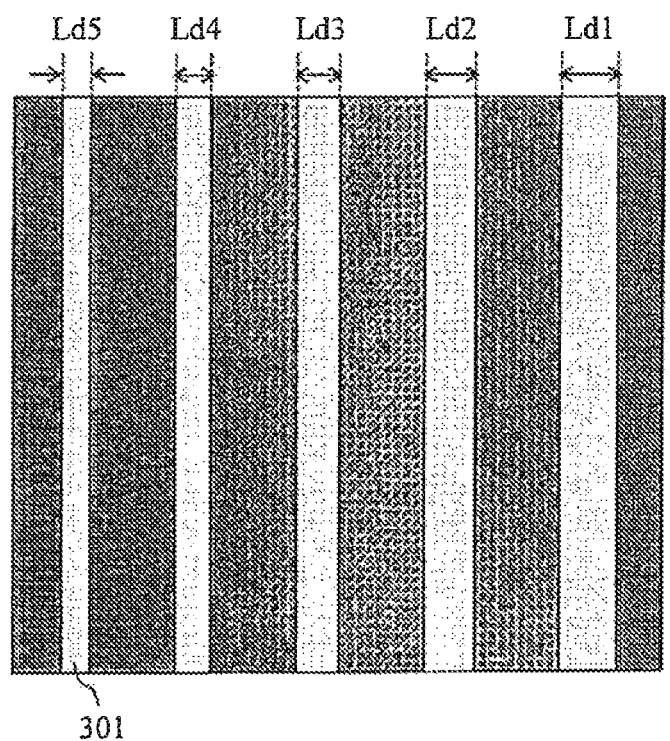

[FIG. 4A]
SAMPLE A (HOLE)
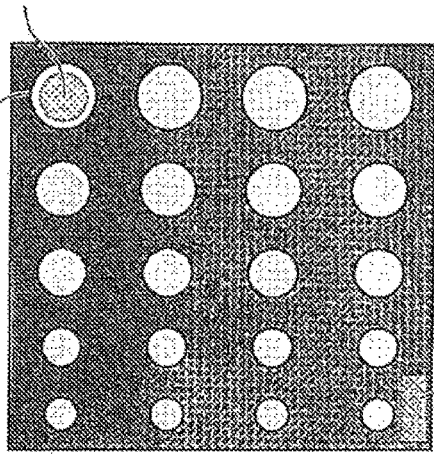
402 AREA FOR ACQUIRING BRIGHTNESS AVERAGE AND BRIGHTNESS VARIATION OF HOLE A
401 HOLE A
403 AREA FOR ACQUIRING BRIGHTNESS AVERAGE OF OXIDE FILM HAVING LOWEST BRIGHTNESS IN SAMPLE
BRIGHTNESS AVERAGE OF HOLE A : Ha
BRIGHTNESS AVERAGE OF OXIDE FILM (DARK PART) : Sa
BRIGHTNESS RATIO OF HOLE A : Ba=Ha/Sa
BRIGHTNESS VARIATION OF HOLE A : Ka (FOR EXAMPLE, 3σ)

[FIG. 4B]
SAMPLE B (TRENCH)
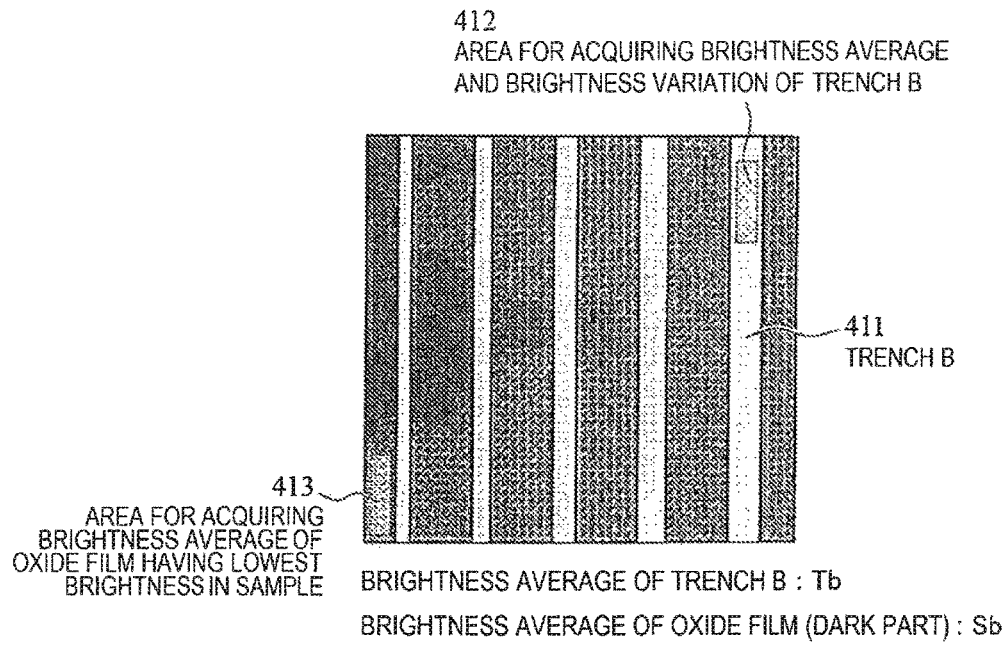
BRIGHTNESS AVERAGE OF TRENCH B : Tb
BRIGHTNESS AVERAGE OF OXIDE FILM (DARK PART) : Sb
BRIGHTNESS RATIO OF TRENCH B : Bb=Tb/Sb
BRIGHTNESS VARIATION OF TRENCH B : Kb (FOR EXAMPLE, $3\sigma$)

[FIG. 5]

SAMPLE A (HOLE)

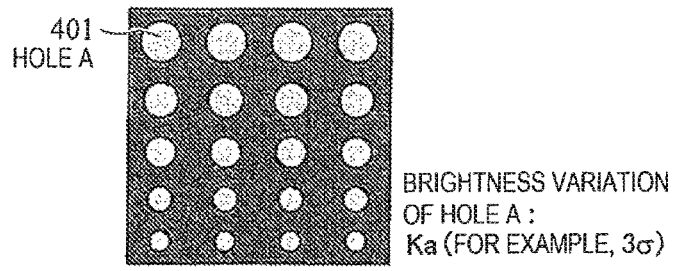

401
HOLE A

BRIGHTNESS VARIATION
OF HOLE A :
Ka (FOR EXAMPLE, 3σ)

ENLARGED IMAGES OF BOTTOM OF HOLE OBTAINED WHEN HOLE A (401) IS OBSERVED
AT ACCELERATION A TO ACCELERATION E (SHOWING BRIGHTNESS VARIATION)

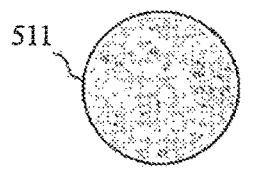 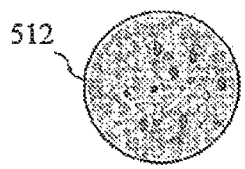 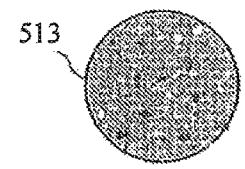

511     512     513

ACCELERATION : A    ACCELERATION : B    ACCELERATION : C

Ka : 0.82    Ka : 1.25    Ka : 0.53

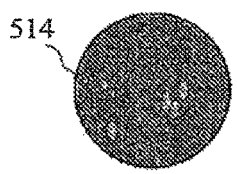 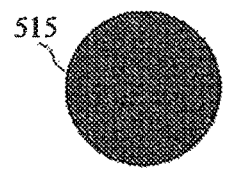

514     515

ACCELERATION : D    ACCELERATION : E

Ka : 0.28    Ka : 0.19

BRIGHTNESS VARIATION: ACCELERATION B > ACCELERATION A > ACCELERATION C
> ACCELERATION D > ACCELERATION E

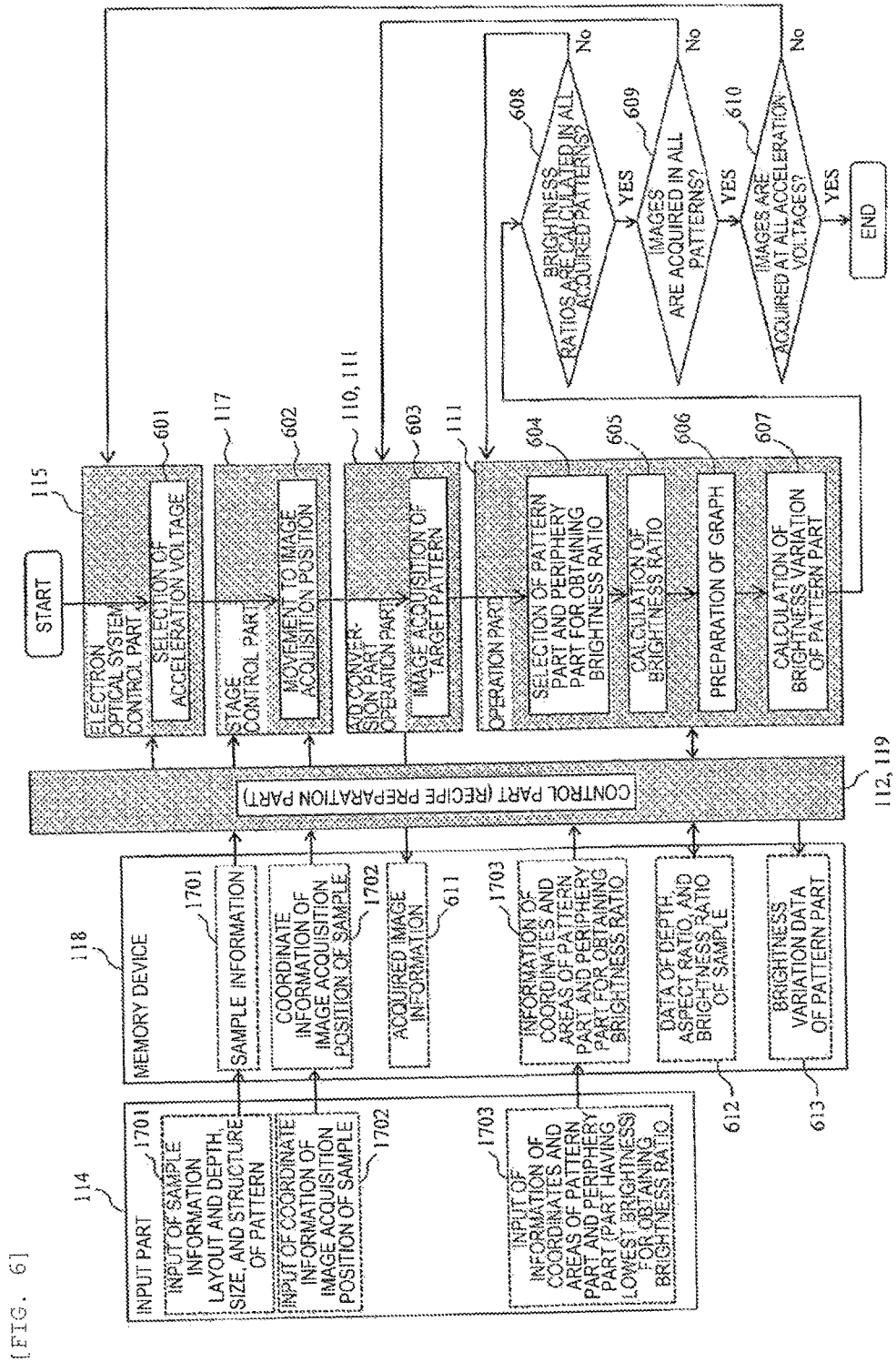

[FIG. 7A]
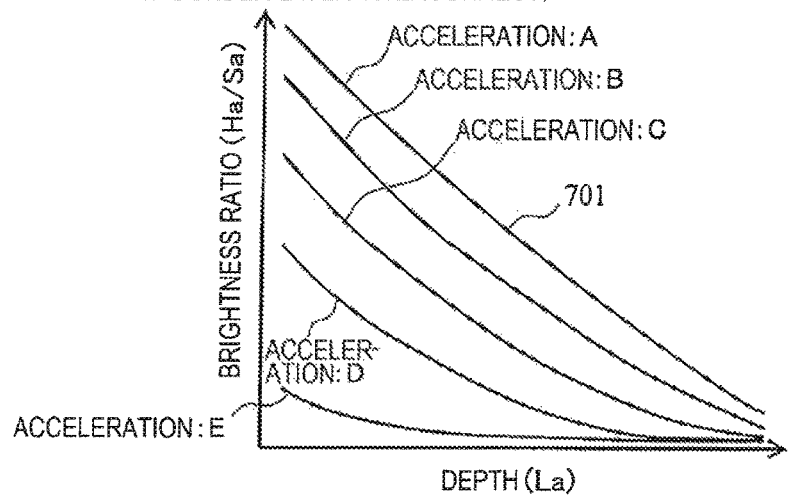
[FIG. 7B]
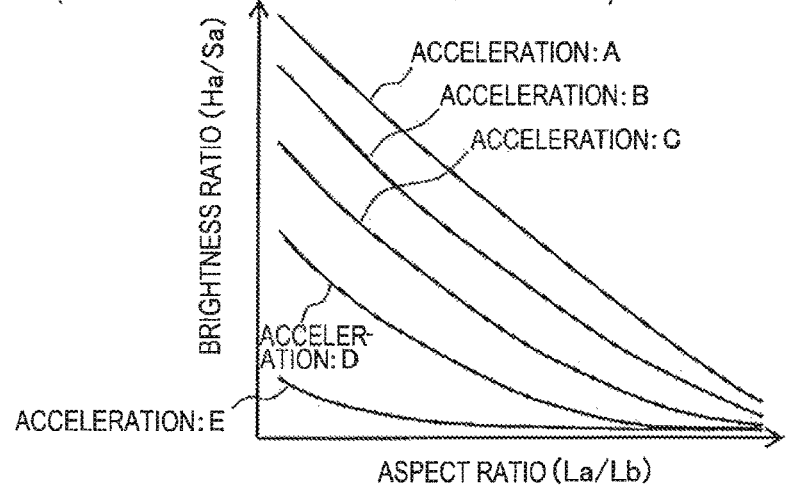

[FIG. 7C]
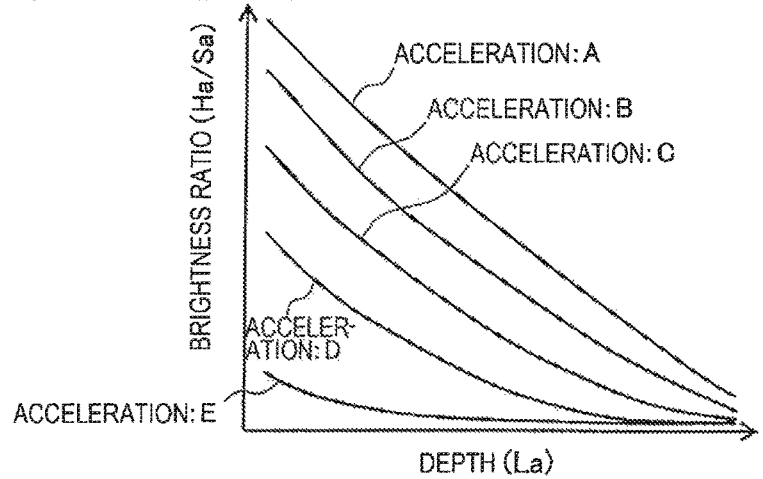
[FIG. 7D]
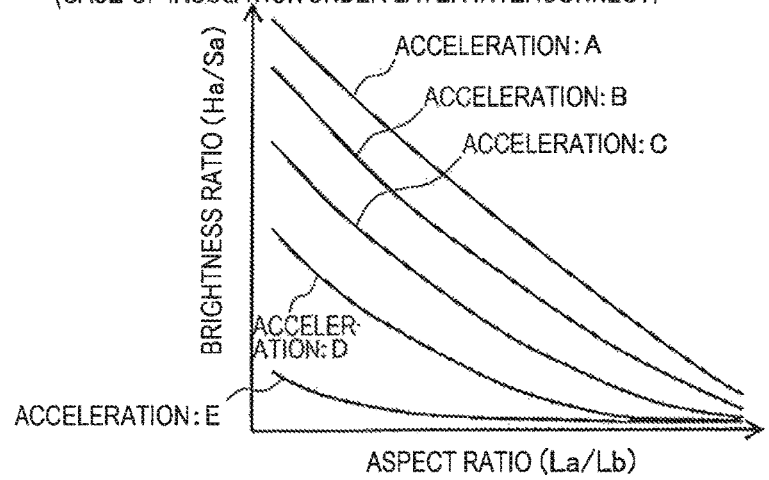

[FIG. 8A]
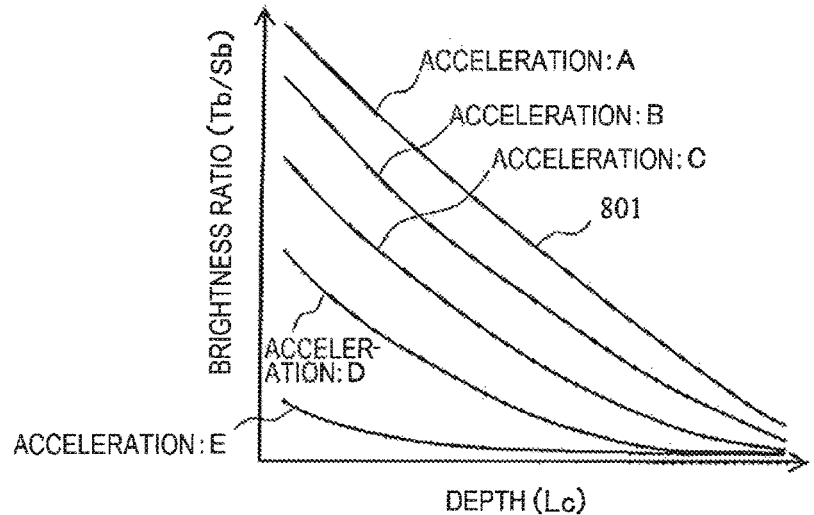
[FIG. 8B]
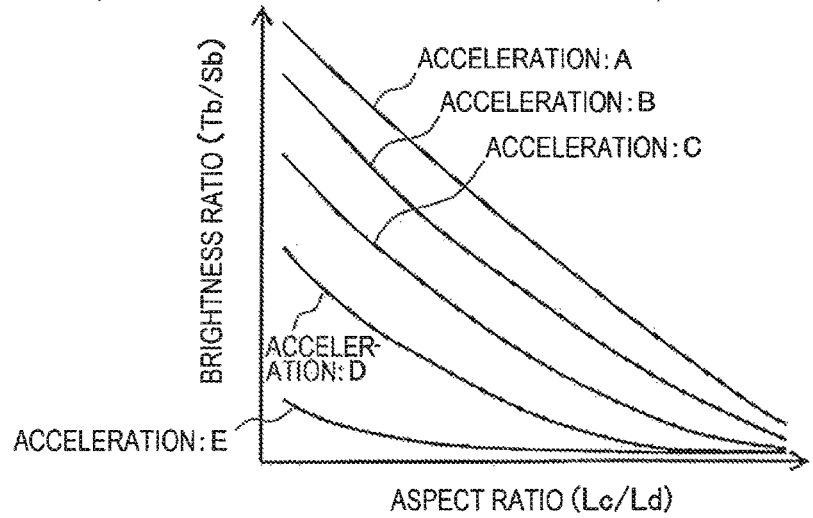

[FIG. 8C]
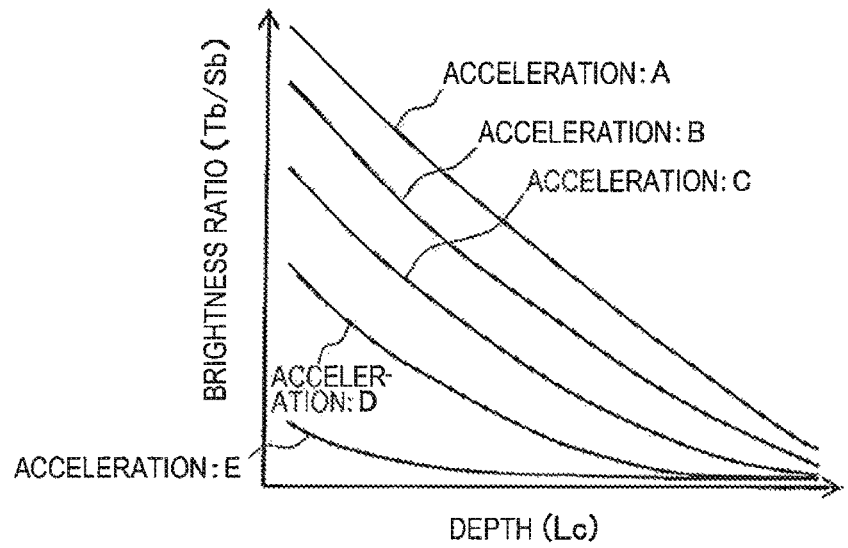
[FIG. 8D]
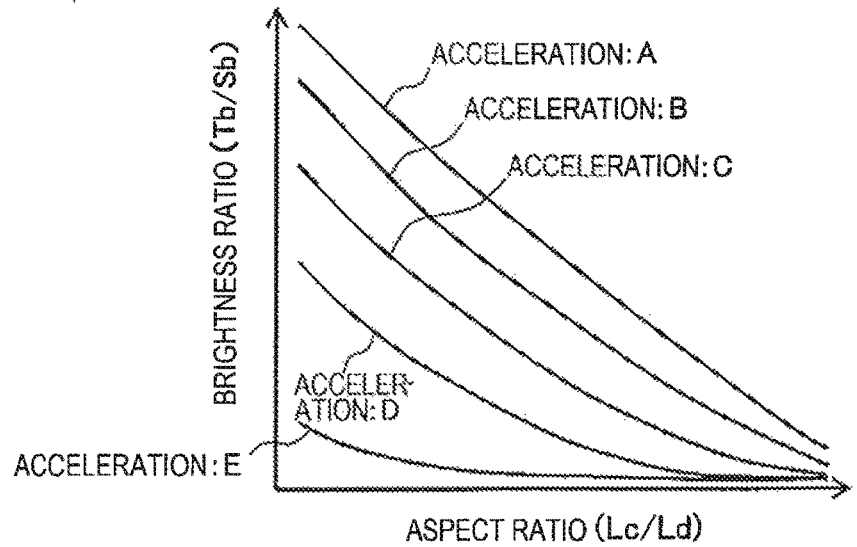

[FIG. 9]
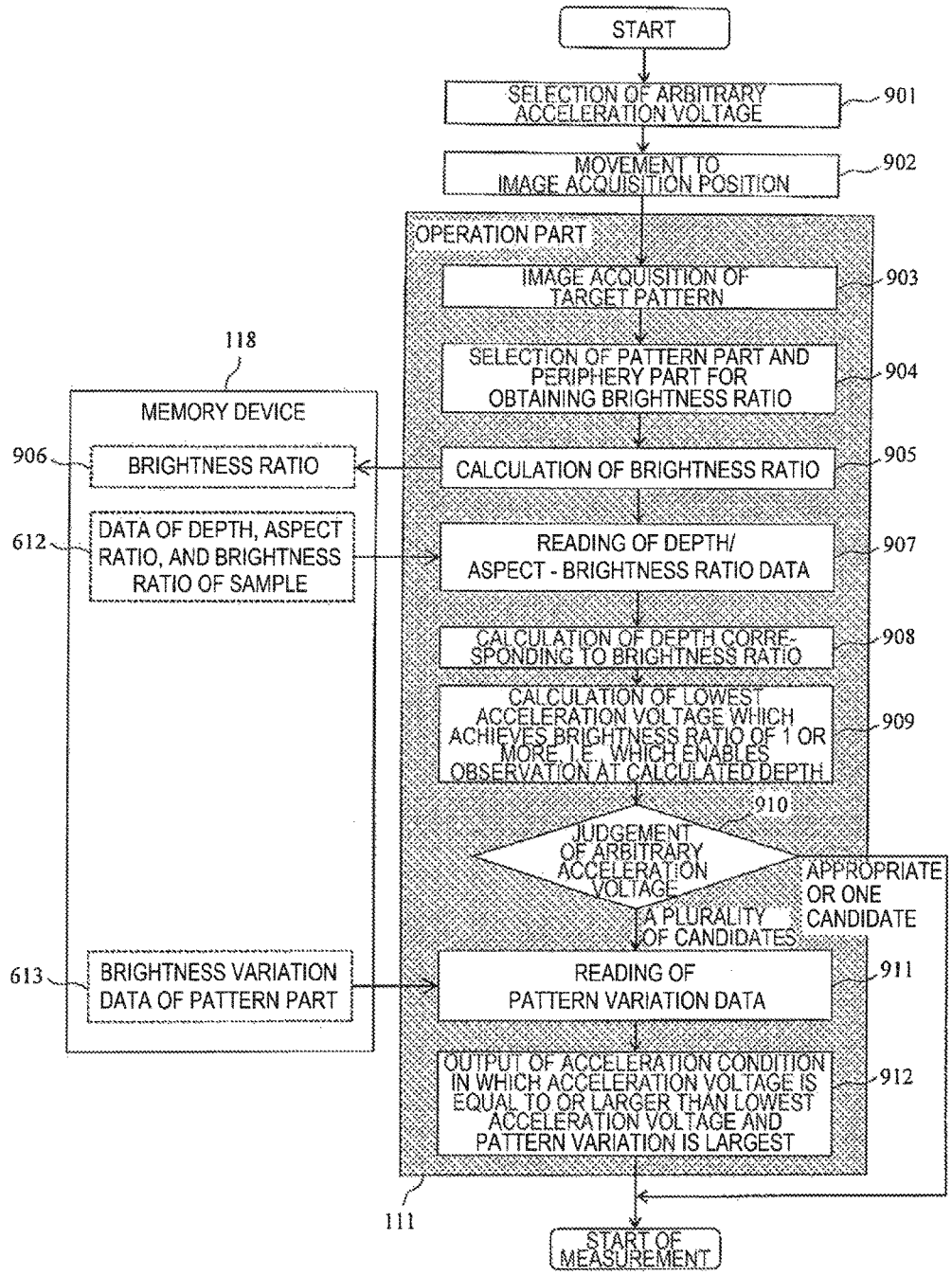

[FIG. 10A]
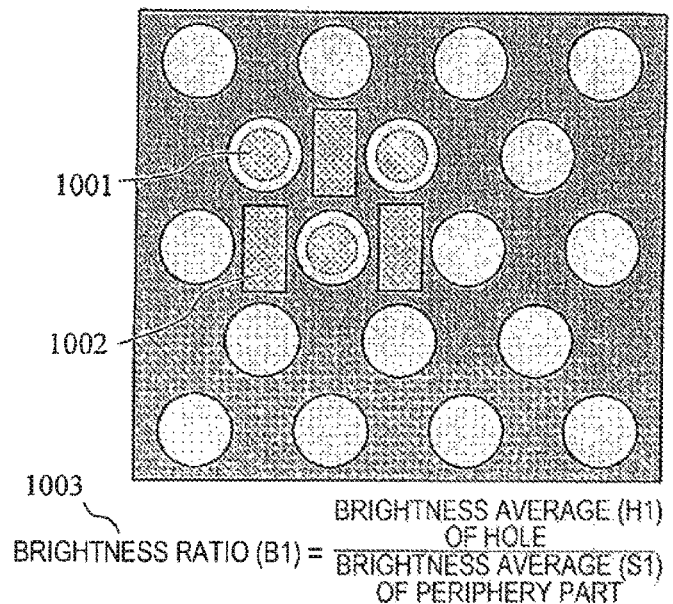

[FIG. 10B]
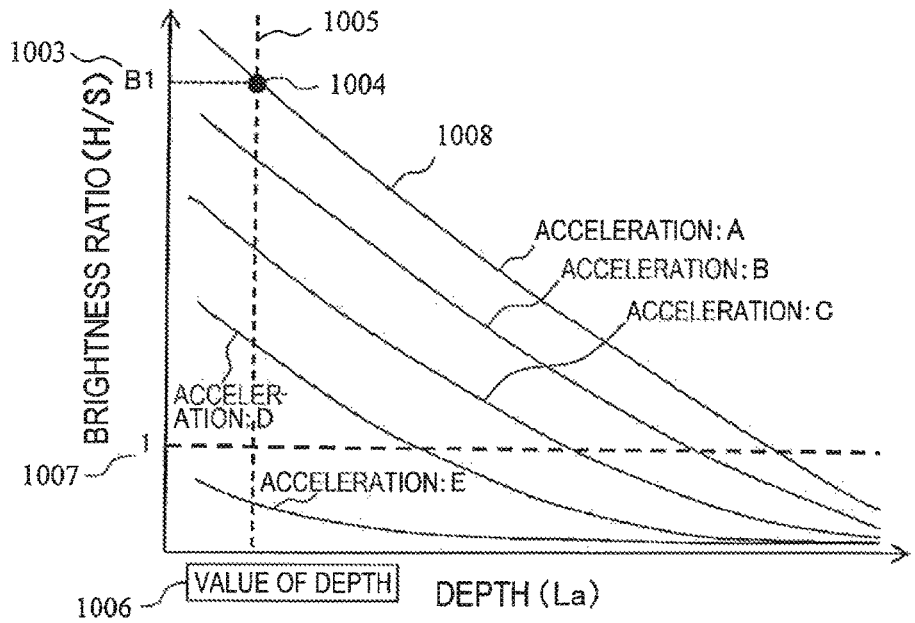
EXAMPLE 1) HOLE SAMPLE (UNDER LAYER METAL) : Hole 1
Hole 1 = OBSERVABLE AT ACCELERATION D OR MORE
BRIGHTNESS VARIATION: ACCELERATION D > ACCELERATION C
> ACCELERATION B > ACCELERATION A
OPTIMAL ACCELERATION CONDITION = ACCELERATION D

[FIG. 11A]
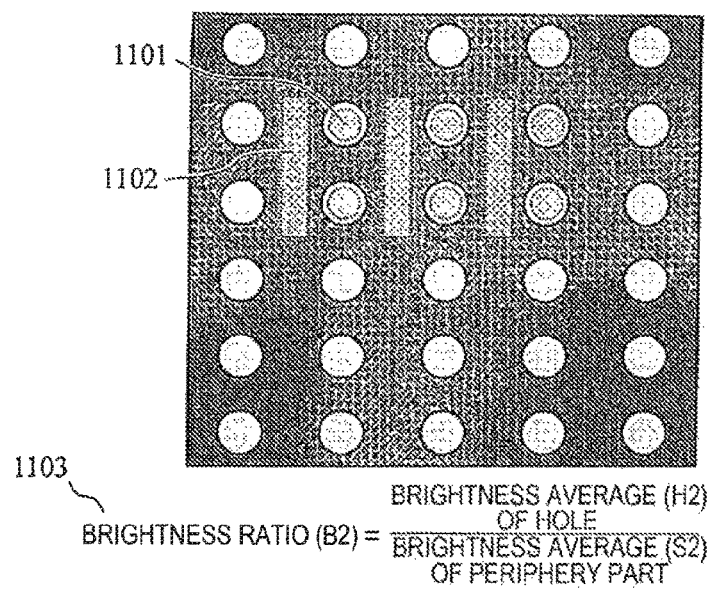

[FIG. 11B]
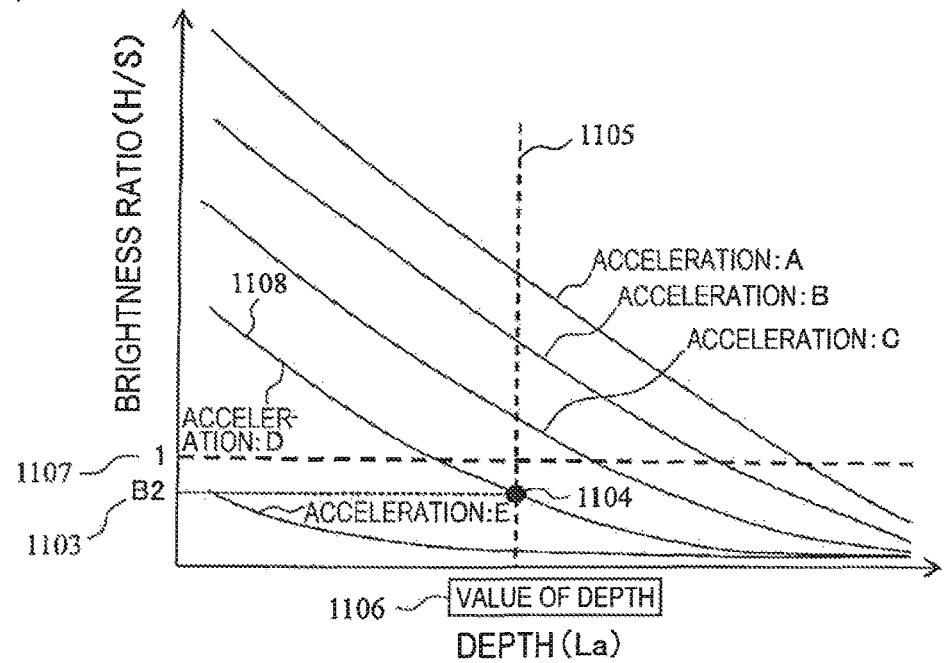

[FIG. 12A]
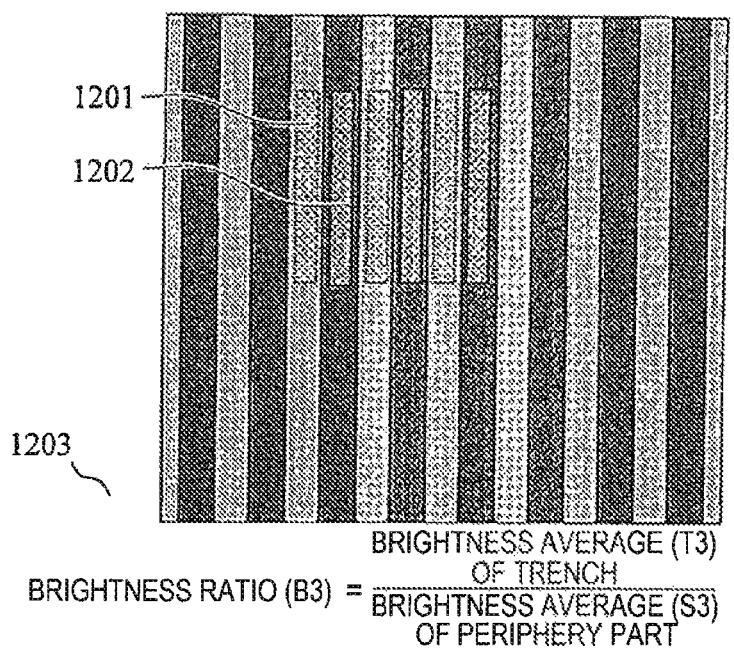

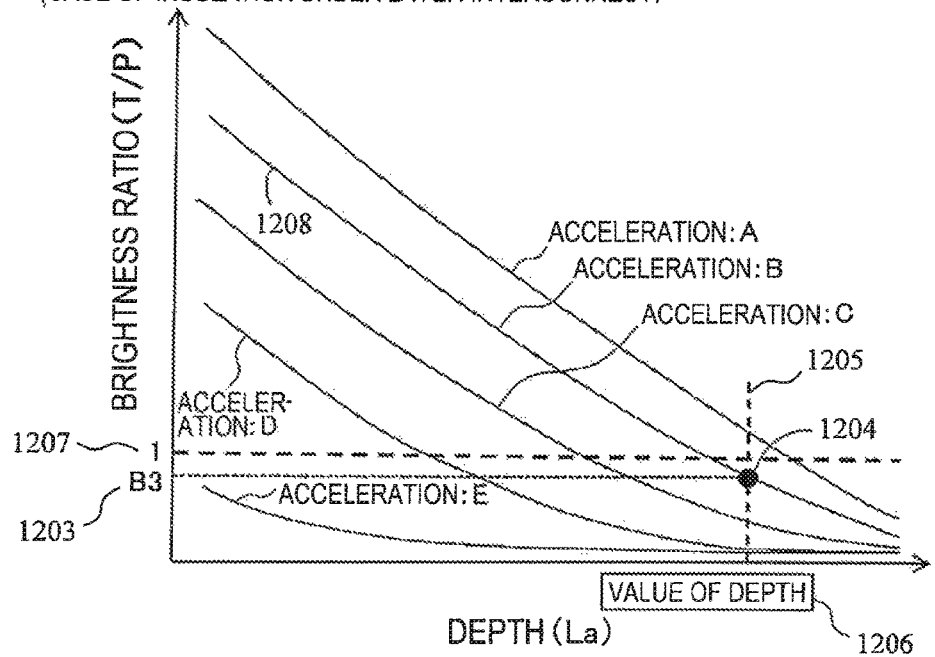

[FIG. 13A]
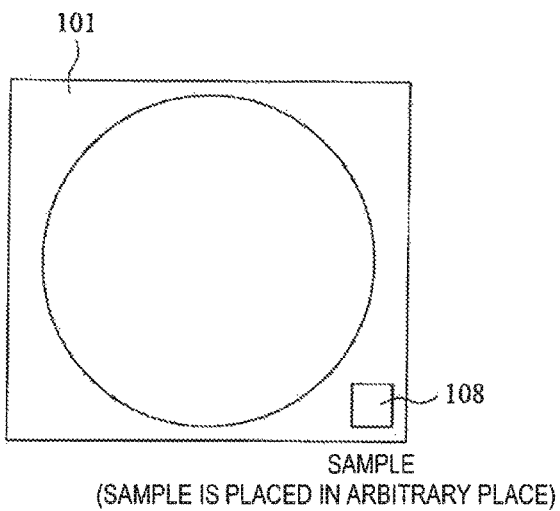
SAMPLE
(SAMPLE IS PLACED IN ARBITRARY PLACE)
[FIG. 13B]
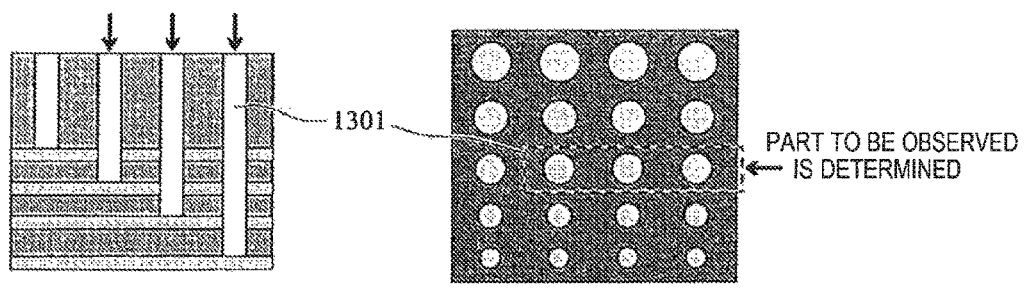

[FIG. 13C]
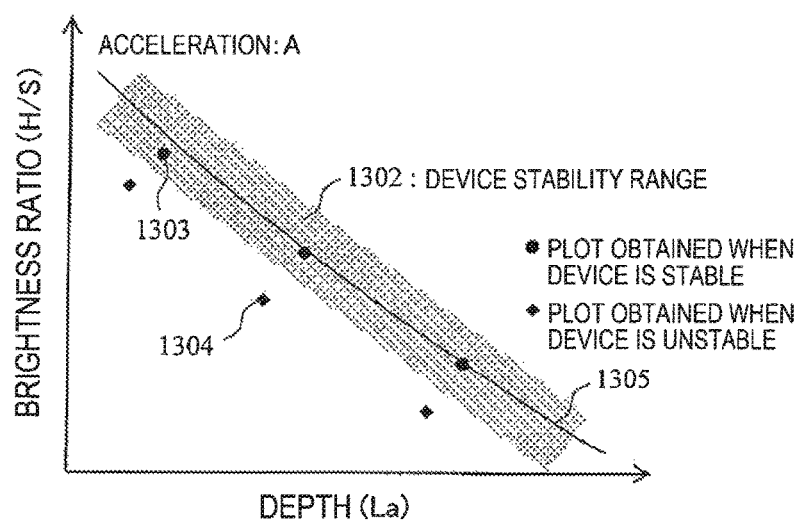

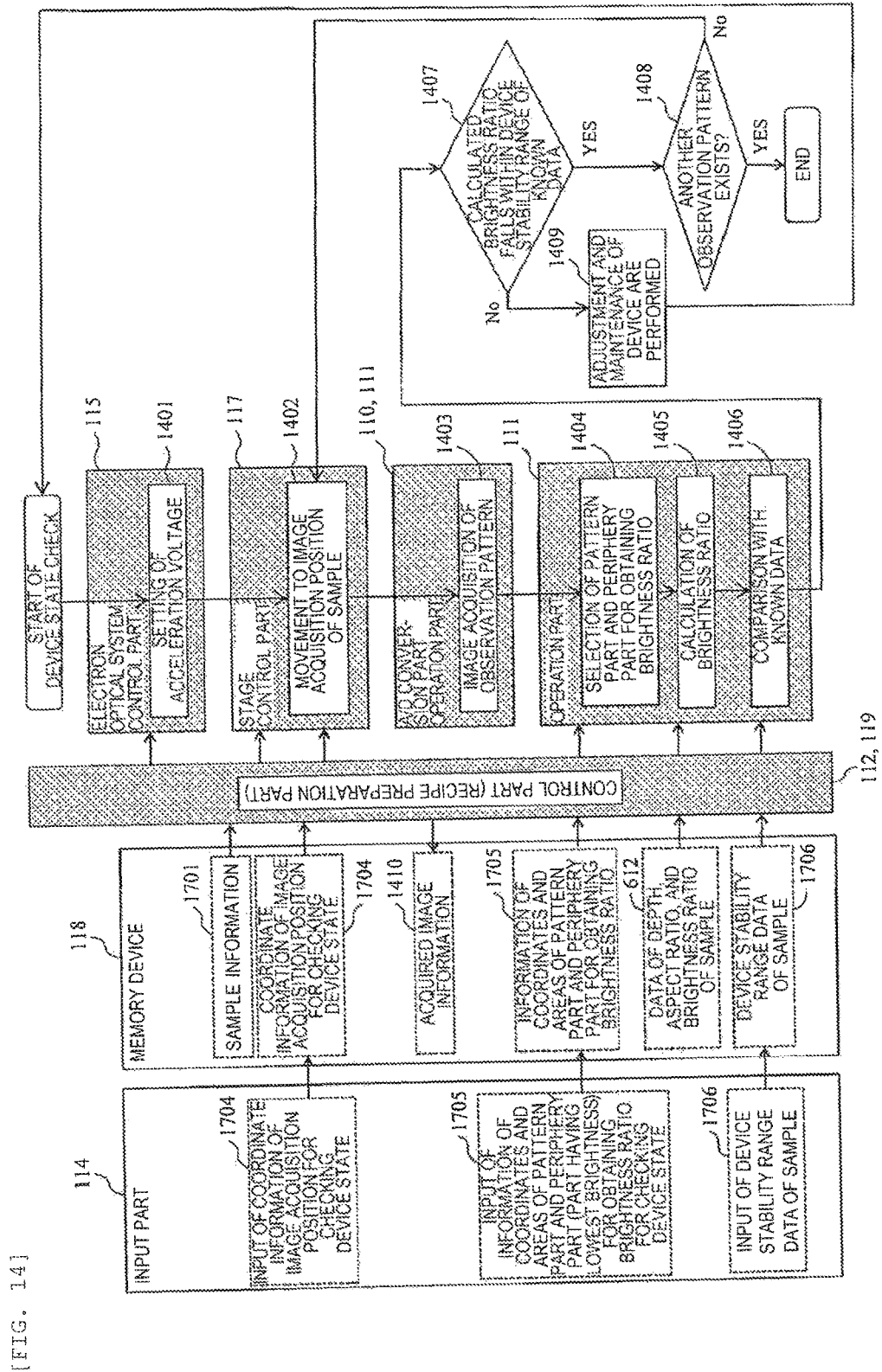
[FIG. 14]

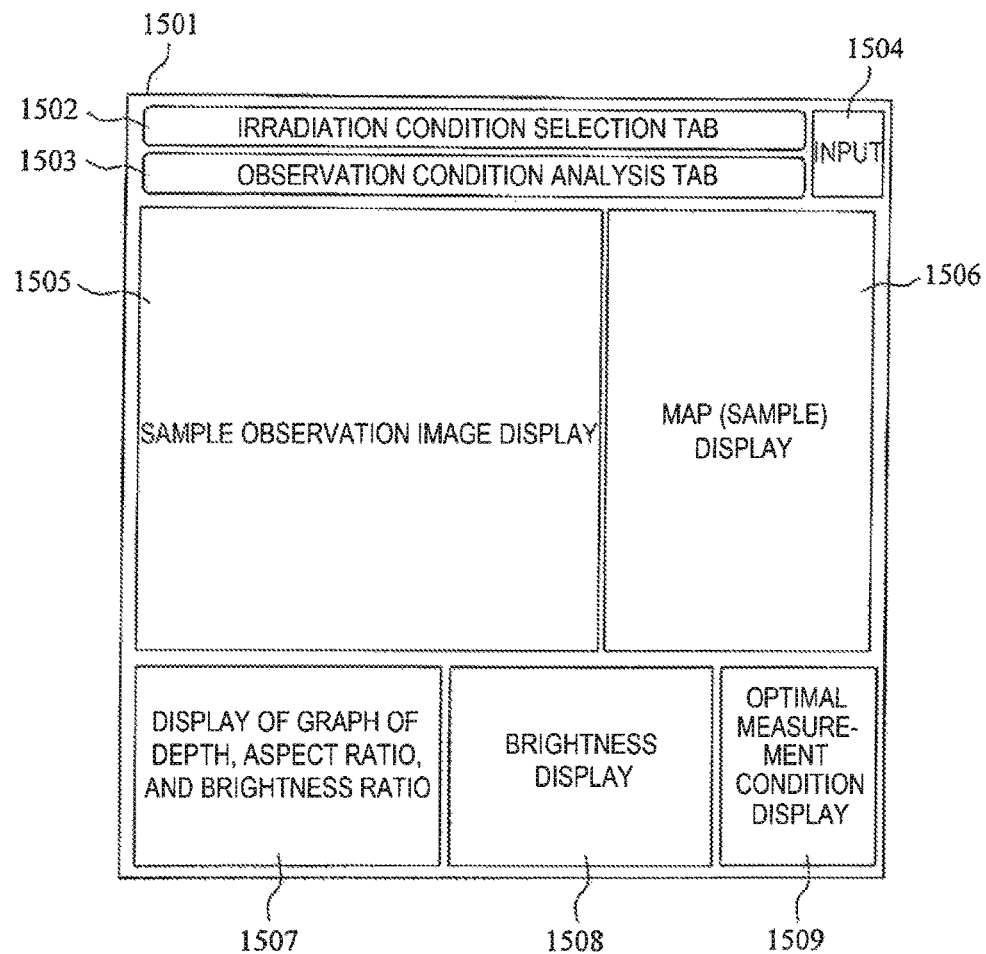
[FIG. 15A]
* NOT ONLY ACCELERATION CONDITION BUT ALSO OTHER MEASUREMENT CONDITIONS (MAGNIFICATION, CURRENT, THE NUMBER OF FRAMES, AND THE LIKE) MAY BE DISPLAYED

[FIG. 15B]
ENLARGED IRRADIATION CONDITION SELECTION TAB
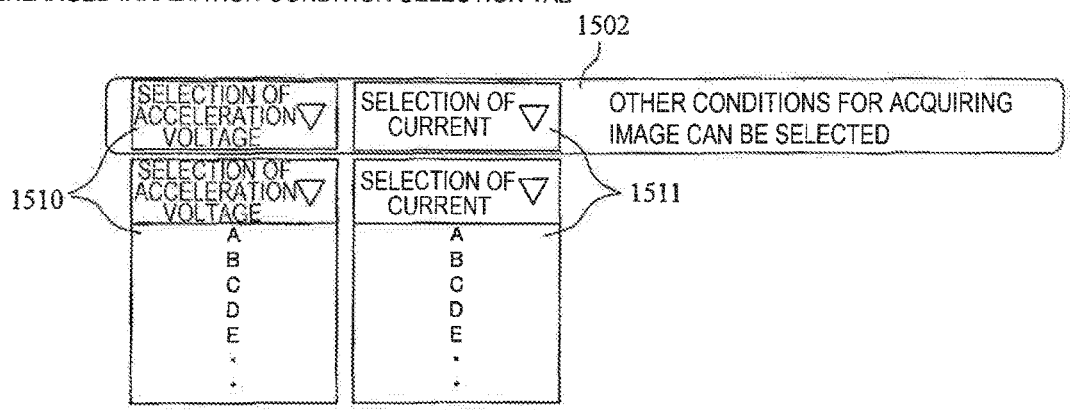
[FIG. 15C]
ENLARGED OBSERVATION CONDITION ANALYSIS TAB
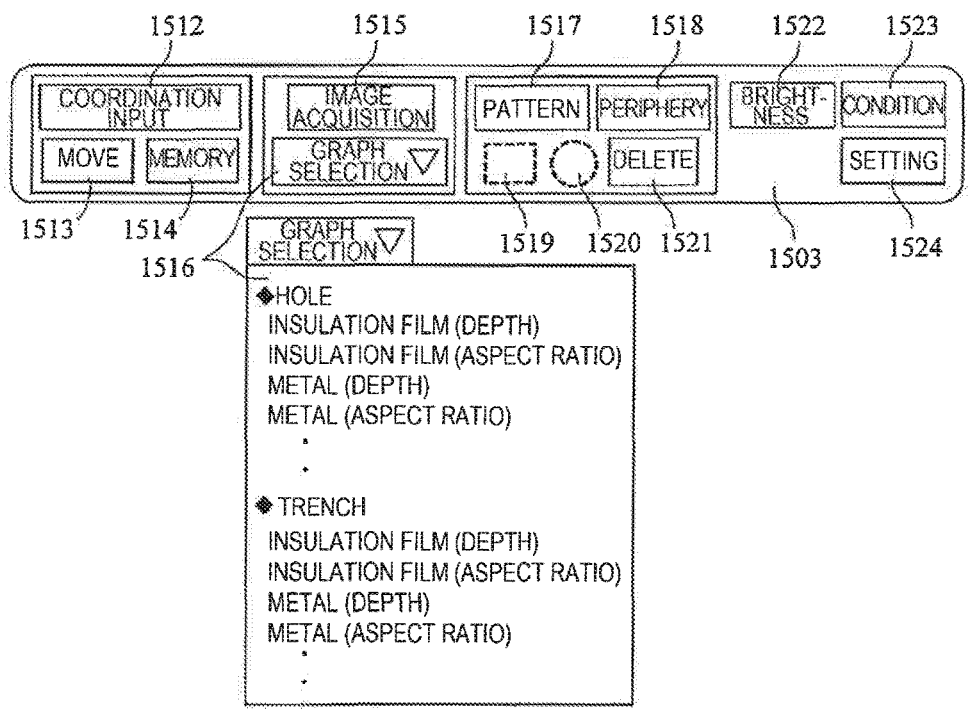

[FIG. 15D]
ENLARGED BRIGHTNESS DISPLAY
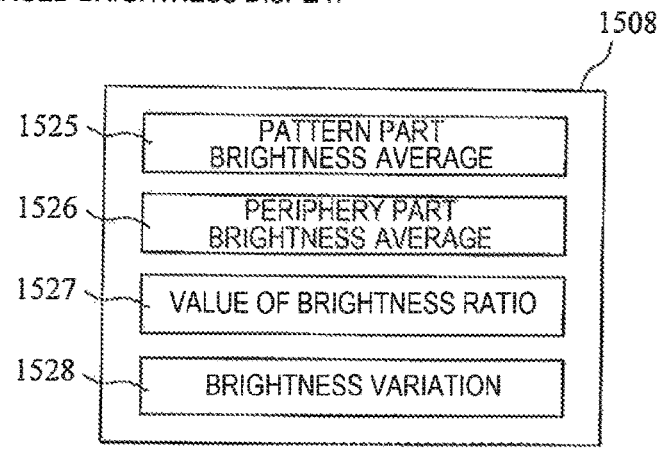
[FIG. 16A]
SAMPLE OBSERVATION IMAGE DISPLAY
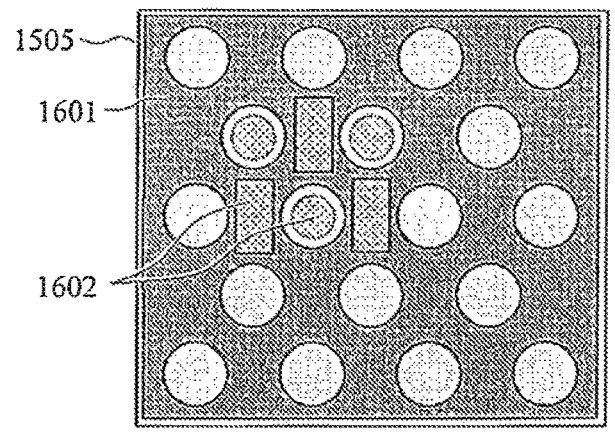

[FIG. 16B]
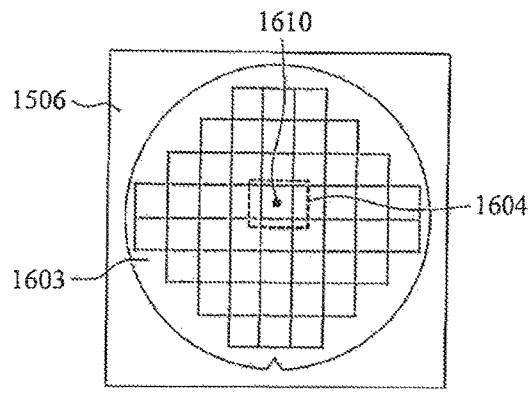
[FIG. 16C]
BRIGHTNESS RATIO - THICKNESS GRAPH DISPLAY
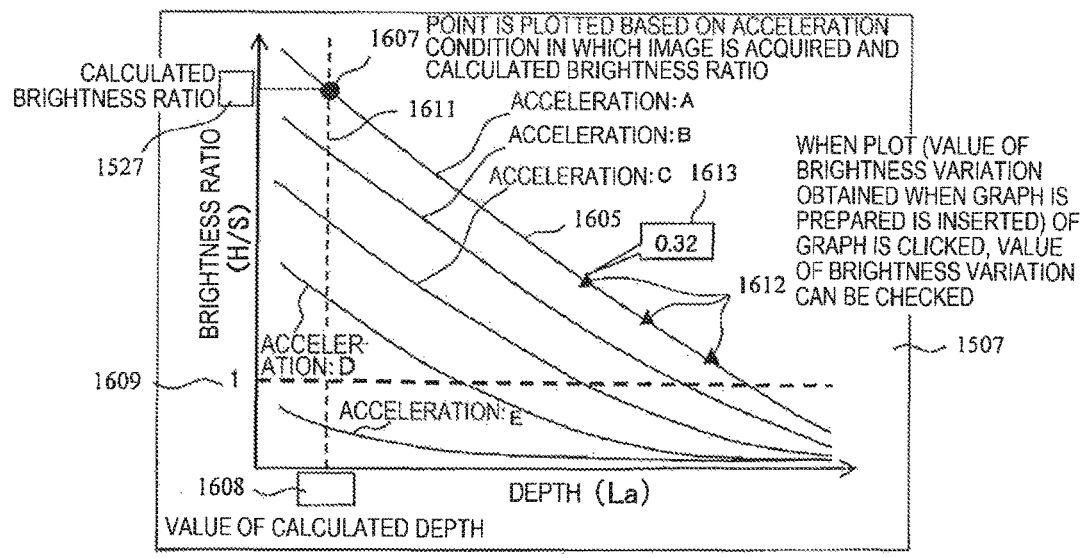

[FIG. 17A]
WINDOW OF INPUT PART
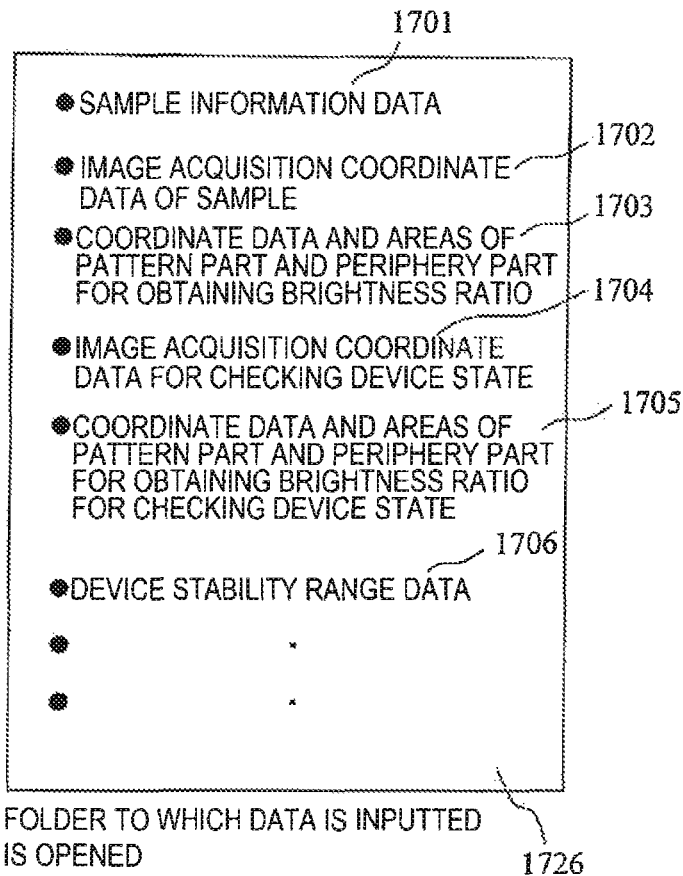
* ALL COORDINATES ARE INDICATED AS
  COORDINATES FROM DIE ORIGIN COORDINATE (1709)

[FIG. 17B]

SAMPLE INFORMATION DATA

```
1707 —— SHOT ARRANGEMENT : X, Y                    1701
1708 —— DIE ARRANGEMENT : X, Y
1709 —— DIE ORIGIN COORDINATE: X, Y
1710 —— ALIGNMENT COORDINATE: (X, Y), (X, Y) ···
1725 —— STRUCTURE:
         METAL INTERCONNECT, INSULATION ··

COORDINATE TO    DEPTH         SIZE OF
         PATTERN PART     (THICKNESS)   PATTERN
         (X, Y)           OF PATTERN
         (X, Y)           La1           Lb1
                          La2           Lb2

IMAGE ACQUISITION COORDINATE DATA OF SAMPLE

```
COORDINATE TO IMAGE
ACQUISITION POSITION —— 1711
(X, Y)
(X, Y)
(X, Y)
(X, Y)
(X, Y)
(X, Y)
1702 ——
```

[FIG. 17D]

COORDINATE DATA AND AREAS OF PATTERN PART AND
PERIPHERY PART FOR OBTAINING BRIGHTNESS RATIO

| COORDINATE TO PATTERN PART | AREA | COORDINATE TO PERIPHERY PART (DARK PART) | AREA |
|---|---|---|---|
| (X, Y) | AA | (X, Y) | FF |
| (X, Y) | BB | | |
| (X, Y) | CC | | |
| (X, Y) | DD | | |
| (X, Y) | EE | | |
| . | . | | |
| . | . | | |
| . | . | | |

IMAGE ACQUISITION COORDINATE DATA FOR
CHECKING DEVICE STATE

1714 —
| COORDINATE TO IMAGE ACQUISITION POSITION FOR CHECKING DEVICE STATE |
|---|
| (X, Y) |
| (X, Y) |
| (X, Y) |
| . |
| . |

1704

[FIG. 17F]
COORDINATE DATA AND AREAS OF PATTERN PART AND PERIPHERY
PART FOR OBTAINING BRIGHTNESS RATIO FOR CHECKING DEVICE STATE
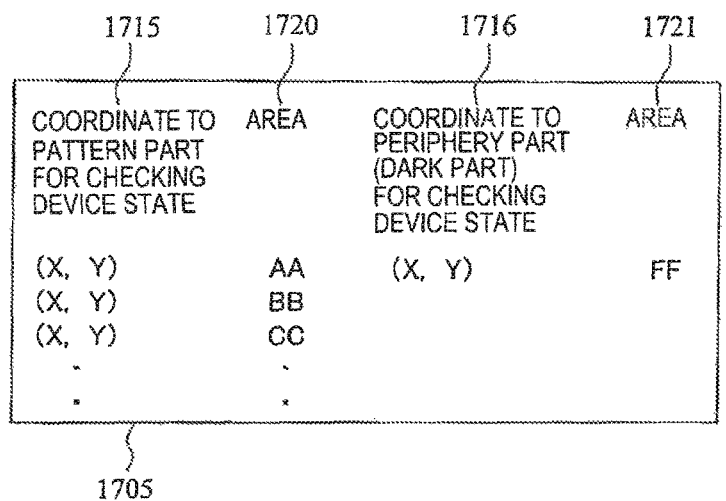
[FIG. 17G]
DEVICE STABILITY RANGE DATA
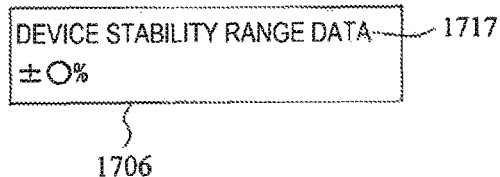

# SAMPLE OBSERVATION DEVICE HAVING A SELECTABLE ACCELERATION VOLTAGE

TECHNICAL FIELD

The present invention relates to a sample observation device.

BACKGROUND ART

In order to increase a capacity of a memory and reduce a bit cost, miniaturization, high integration, and the like of a semiconductor device have been performed so far. However, it is expected that a miniaturization process technology will be even more difficult, costs of a processing device will be steeply risen, and difficulty of the device will be increased. Therefore, reduction in the bit cost brought about by miniaturization becomes extremely difficult.

In recent years, as a method of reducing the bit cost while maintaining a large capacity without depending entirely on miniaturization, a 3D structure device, which is obtained by three-dimensionally forming a conventional planar structure, has been developed. The 3D structure device is a stacked LSI and therefore has a thicker layer than that of a conventional device. Therefore, in a step for forming a hole, a trench, or the like, an aspect ratio thereof (a ratio of a plane size of the hole or the trench to a depth thereof) tends to be further increased. Thus, an inspection technology and a measurement technology for evaluating performance of a sample in such development of the 3D structure device become more important.

A conventional inspection technology and a conventional measurement technology mainly use a low acceleration voltage region in view of resolution and secondary electron generation efficiency. However, because the aspect ratio becomes larger than before in the 3D structure device, it becomes difficult to observe a bottom of a hole, a trench, or the like with the conventional inspection method and the conventional measurement method.

As a method of compensating this, there is a method of irradiating a deeper position of a sample with electrons in a condition of a high acceleration voltage. With this method, secondary electrons and reflection electrons are efficiently detected, which makes it possible to observe a hole, a trench, or the like and perform inspection and measurement. PTL 1 discloses a semiconductor device analysis device capable of accurately analyzing a microstructure in a bottom of a hole having a large aspect ratio by using a substrate current.

CITATION LIST

Patent Literature

PTL 1: JP-A-2004-235464

SUMMARY OF INVENTION

Technical Problems

PTL 1 discloses a technology for enabling accurate analysis of a microstructure in a bottom of a hole having a large aspect ratio by using a substrate current and estimating a thickness of a residue existing in the bottom of the hole. However, in the case where a pattern exists in a lower layer, it is difficult to perform measurement using a substrate current, and the thickness of the residue is also limited.

A condition of a high acceleration voltage is effective in inspection and measurement of a 3D structure device having a large aspect ratio. However, an optimal measurement condition is changed depending on a structure of the 3D structure device, a depth of a pattern, and the like. Therefore, in the case where a high acceleration voltage region is also used, measurement conditions to be considered are enormously increased, which takes time to determine the optimal measurement condition. Further, determination of the measurement condition may be changed depending on operator's skill, resulting in generation of variation caused by human factors.

The invention has been made in view of those circumstances and provides a sample observation device which can easily determine a measurement condition without generating variation caused by human factors.

Solution to Problems

In order to solve the above problems, for example, configurations described in Claims are employed. The present application includes a plurality of means for solving the above problems, and, as an example thereof, there is provided a sample observation device including: a charged particle optical column for irradiating a sample with charged particle beams at a first acceleration voltage, the sample having a target part to be observed which is a concave part; an image acquisition part for acquiring an image including the target part to be observed on the basis of signals obtained by irradiation with the charged particle beams; a memory part for memorizing in advance, at each of a plurality of acceleration voltages, information indicating a relationship between a brightness ratio of a concave part in a standard sample to a periphery part of the concave part and a value indicating a structure of the concave part in the standard sample; and an operation part for obtaining a brightness ratio of the concave part to a periphery part of the concave part in the image, in which the operation part judges appropriateness/inappropriateness of the first acceleration voltage with the use of the information indicating the relationship and the brightness ratio in the image.

According to another example, there is provided a sample observation device including: a charged particle optical column for irradiating a sample with charged particle beams at a certain acceleration voltage, the sample having a target part to be observed which is a concave part; an image acquisition part for acquiring an image including the target part to be observed on the basis of signals obtained by irradiation with the charged particle beams; a memory part for memorizing in advance, at each of a plurality of acceleration voltages, information indicating a relationship between a brightness ratio of a concave part to a periphery part of the concave part in a standard sample and a value indicating a structure of the concave part in the standard sample; a display part for displaying the information indicating the relationship; and an input part for changing the acceleration voltage applied to the sample.

According to still another example, there is provided a sample observation device including: a charged particle optical column for irradiating a standard sample with charged particle beams at a certain acceleration voltage, the standard sample having a concave part whose structure is known; an image acquisition part for acquiring an image having the concave part on the basis of signals obtained by irradiation with the charged particle beams; a memory part for memorizing in advance information indicating a relationship between a brightness ratio of a concave part in the standard sample to a periphery part of the concave part and a value indicating a structure of the concave part in the standard sample; and an operation part for obtaining the brightness ratio of the concave part to the periphery part of the concave part in the image, in which the operation part judges whether or not a state of the sample observation device is normal with the use of the information indicating the relationship, the brightness ratio in the image, and information of a structure of the concave part of the standard sample.

Advantageous Effects of Invention

According to the invention, it is possible to reduce a time required for determining an optimal measurement condition and is also possible to reduce variation caused by human factors.

Further features related to the invention will be disclosed by the description of the present specification and attached drawings. Problems, configurations, and effects other than those described above will be disclosed by the description of examples described below.

BRIEF DESCRIPTION OF DRAWINGS

FIG. 1A is a block diagram of a scanning electron microscope of the invention.

FIG. 1B is a block diagram of an operation part of the invention.

FIG. 2A is a cross-sectional view of an example of a sample (standard sample) having holes.

FIG. 2B is a planar view of an example of a sample (standard sample) having holes.

FIG. 3A is a cross-sectional view of an example of a sample (standard sample) having trenches.

FIG. 3B is a planar view of an example of a sample (standard sample) having trenches.

FIG. 4A is an explanatory view of a method of calculating a brightness ratio and brightness variation in the sample illustrated in FIG. 2B.

FIG. 4B is an explanatory view of a method of calculating a brightness ratio and brightness variation in the sample illustrated in FIG. 3B.

FIG. 5 is an explanatory view of examples of brightness variation.

FIG. 6 shows a flow in which a relationship between a depth and a brightness ratio, a relationship between an aspect ratio and the brightness ratio, and brightness variation of a pattern part are calculated in Example 1.

FIG. 7A is a graph showing a relationship between a depth and a brightness ratio in a sample having holes (in the case of an under layer interconnect made of metal).

FIG. 7B is a graph showing a relationship between an aspect ratio and a brightness ratio in a sample having holes (in the case of an under layer interconnect made of metal).

FIG. 7C is a graph showing a relationship between a depth and a brightness ratio in a sample having holes (in the case of an under layer interconnect made of insulation).

FIG. 7D is a graph showing a relationship between an aspect ratio and a brightness ratio in a sample having holes (in the case of an under layer interconnect made of insulation).

FIG. 8A is a graph showing a relationship between a depth and a brightness ratio in a sample having trenches (in the case of an under layer interconnect made of metal).

FIG. 8B is a graph showing a relationship between an aspect ratio and a brightness ratio in a sample having trenches (in the case of an under layer interconnect made of metal).

FIG. 8C is a graph showing a relationship between a depth and a brightness ratio in a sample having trenches (in the case of an under layer interconnect made of insulation).

FIG. 8D is a graph showing a relationship between an aspect ratio and a brightness ratio in a sample having trenches (standard sample including an under layer interconnect made of insulation).

FIG. 9 shows a flow in which an optimal measurement condition is obtained in Example 1.

FIG. 10A illustrates a first example of calculation of the optimal acceleration condition shown in the flow of FIG. 9.

FIG. 10B illustrates the first example of calculation of the optimal acceleration condition shown in the flow of FIG. 9.

FIG. 11A illustrates a second example of calculation of the optimal acceleration condition shown in the flow of FIG. 9.

FIG. 11B illustrates the second example of calculation of the optimal acceleration condition shown in the flow of FIG. 9.

FIG. 12A illustrates a third example of calculation of the optimal acceleration condition shown in the flow of FIG. 9.

FIG. 12B illustrates the third example of calculation of the optimal acceleration condition shown in the flow of FIG. 9.

FIG. 13A is a planar view of a sample stage in Example 2.

FIG. 13B is an example of a sample (standard sample).

FIG. 13C is a graph showing a relationship between a depth and a brightness ratio in a sample having holes (in the case of an under layer interconnect made of metal).

FIG. 14 shows a flow in which a device state is checked in Example 2.

FIG. 15A illustrates an entire configuration of a screen displayed on a monitor.

FIG. 15B is an enlarged view of an irradiation condition selection tab.

FIG. 15C is an enlarged view of an irradiation condition selection tab.

FIG. 15D is an enlarged view of a brightness display part.

FIG. 16A illustrates an example of image information displayed on a sample observation image display part.

FIG. 16B illustrates an example of a map displayed on a map display part.

FIG. 16C illustrates an example of a graph displayed on a graph display part.

FIG. 17A illustrates an example of a window which is opened when an input button is pushed.

FIG. 17B illustrates an example of sample information data.

FIG. 17C illustrates an example of coordinate information of an image acquisition position of a sample.

FIG. 17D illustrates an example of information of coordinates and areas of a pattern part and a periphery part for obtaining a brightness ratio.

FIG. 17E illustrates an example of coordinate information of an image acquisition position for checking a device state.

FIG. 17F illustrates an example of information of coordinates and areas of a pattern part and a periphery part for obtaining a brightness ratio of a pattern used for checking a device state.

FIG. 17G illustrates an example of device stability range data.

DESCRIPTION OF EMBODIMENTS

Hereinafter, examples of the invention will be described with reference to attached drawings. Note that the attached drawings illustrate specific examples based on a principle of the invention, and those drawings are used for understanding the invention and are never used for limitedly interpreting the invention.

As a sample observation device, there is a charged particle beam device which scans a surface of a sample with charged particle beams (for example, electrons) and uses electrons which are secondarily generated. As a typical example of the charged particle beam device, there is an electron microscope (SEM: Scanning Electron Microscope). The invention is applicable to all electron microscopes, and is applicable to, for example, a review SEM, a CD (critical dimension)-SEM, an OL (overlay)-SEM, and an electron beam inspection device.

Example 1

Hereinafter, an embodiment of this example will be described with reference to the drawings. FIG. 1A illustrates a scanning electron microscope to which the invention is applied.
<Configuration of Scanning Electron Microscope>

A configuration of the scanning electron microscope will be described. In the scanning electron microscope of this example, a single set of samples to be observed is conveyed. The scanning electron microscope includes sample receiving means (not illustrated) for receiving the single set of samples thus conveyed. A sample to be observed is subsequently selected from the single set of samples. The scanning electron microscope moves the selected sample to a sample chamber via a sample preparation chamber (not illustrated) of the scanning electron microscope and places the selected sample on a sample stage 101.

The scanning electron microscope of this example includes an imaging device 102. The imaging device 102 includes, as a charged particle optical column for performing irradiation with electron beams EB, an electron source 103 connected to a high voltage power supply 116, and an electron optical system described below. Further, the electron optical system includes a condenser lens 104, a deflection coil 105, and an objective lens 106.

The electron source 103 includes an electron gun including a cathode (not illustrated) kept at a negative high voltage potential and an anode (not illustrated) arranged in an outlet port of electron beams. In the electron source 103, a voltage applied between the cathode and the anode of the electron gun is changeable. Accelerated electrons are emitted by changing the voltage. Note that there are two methods of changing an acceleration voltage, i.e., a method of changing a voltage applied to the electron source 103 and a method (retarding) of applying a negative voltage to the sample stage 101 to control the acceleration voltage. Any one of those two methods may be used as the method of changing the acceleration voltage.

As described above, the scanning electron microscope includes the sample stage 101 on which a sample 107 to be observed is placed. The scanning electron microscope further includes detectors 109 and 125 for detecting secondary charged particles such as secondary electrons or reflection electrons from the sample 107 to be observed. A configuration of the invention is not limited to the example of FIG. 1, and another configuration may be also employed.

Electron beams EB emitted from the electron source 103 are converged by the condenser lens 104. The converged electron beams EB are deflected by the deflection coil 105 so as to scan the sample 107 to be observed on the sample stage 101. Furthermore, the electron beams EB are converged by the objective lens 106 on the sample 107 to be observed, which is placed on the sample stage 101, and thus the sample 107 to be observed is irradiated and scanned.

By irradiation with the electron beams EB, secondary charged particles having information of the sample, such as secondary electrons or reflection electrons, are emitted from the sample 107 to be observed. The secondary charged particles are detected by the detectors 109 and 125. Output from the detectors 109 and 125 is digitized in an A/D conversion part 110. Thereafter, an operation part 111 generates an image by associating a scanning position of the electron beams EB with a pixel. Output from the operation part 111 is transmitted to a monitor (display part) 113 via a control part 112. Then, a SEM image of the sample 107 to be observed is displayed on the monitor 113. Further, the operation part 111 stores the generated SEM image in a memory device 118.

The scanning electron microscope includes, as a control system, the control part 112 for controlling the entire device, an electron optical system control part 115 for controlling the lenses 104 and 106, the coil 105, and the like included in the electron optical system, and a stage control part 117 for controlling the sample stage 101. The scanning electron microscope further includes the operation part 111.

Herein, the operation part 111 and the control part 112 may be configured by hardware such as a dedicated circuit board. Alternatively, the operation part 111 and the control part 112 may be realized with the use of a general computer or may be realized as a function of a program executed in a computer. That is, processing of the operation part 111 and the control part 112 described below may be stored as program codes in a memory part such as a memory and may be realized by a processor such as a CPU (Central Processing Unit) executing each program code.

A characteristic of this example will be described. In this example, a standard sample having concave parts (holes, trenches, or the like) is observed by the scanning electron microscope. Herein, the wording "standard sample" means a standard sample having a plurality of concave parts whose structures are different and are known. At this time, information indicating a relationship between a brightness ratio of a concave part in the standard sample to a periphery part of the concave part and a value indicating a structure of the concave part in the standard sample is prepared at each of a plurality of acceleration voltages, and the prepared information is memorized in the memory device 118 in advance. Herein, the wording "a brightness ratio of a concave part in the standard sample to a periphery part of the concave part" preferably means a ratio of a brightness average of a part of the concave part to a brightness average of a part having the lowest brightness in the periphery part of the concave part. Further, the wording "a value indicating a structure of the concave part" means a depth, an aspect ratio (a ratio of a plane size of the concave part to a depth of the concave part), and the like.

A sample having a concave part to be actually observed (target part to be observed) is observed by the scanning microscope in an arbitrary measurement condition. The scanning microscope generates an image in the arbitrary measurement condition and calculates a brightness ratio of the concave part to a periphery part of the concave part in the image. Whether or not the arbitrary measurement condition is appropriate is judged with the use of the brightness ratio calculated herein and the above information of the relationship memorized in the memory device 118. In the case where the arbitrary measurement condition is inappropriate, the scanning microscope outputs at least one appropriate measurement condition. As another example, in the case where the arbitrary measurement condition is inappropriate, the scanning microscope sets another measurement condition and judges again whether or not the measurement condition is appropriate.

<Configuration of Operation Part>

The operation part 111 for performing the above processing will be described. FIG. 1B illustrates a configuration of the operation part 111 of the invention. The operation part 111 includes an image acquisition part 131, a selection part 132, a brightness ratio calculation part 133, a graph preparation part 134, a variation calculation part 135, a measurement condition determination part 136, and a device state judgment part 137.

As to output from the A/D conversion part 110, the image acquisition part 131 generates a SEM image by associating a scanning position of electron beams EB with a pixel. The selection part 132 receives input from an input part 114 and selects a pattern part and a periphery part for obtaining a brightness ratio in the SEM image. The brightness ratio calculation part 133 calculates the brightness ratio of the selected pattern part to the selected periphery part. The graph preparation part 134 prepares a graph showing a relationship between the brightness ratio of the pattern part to the periphery part and a depth or an aspect ratio. The variation calculation part 135 calculates brightness variation of the selected pattern part.

In the case where a sample having a concave part to be actually observed is observed in an arbitrary measurement condition, the measurement condition determination part 136 judges whether or not the arbitrary measurement condition is appropriate. In the case where the arbitrary measurement condition is inappropriate, the measurement condition determination part 136 outputs an optimal measurement condition. Further, in the case where a sample 108 having a concave part whose structure is known is observed in a predetermined measurement condition, the device state judgment part 137 judges whether or not a state of the device is normal. Judgement of the device state will be described in detail below.

<Graph Preparing Processing Based on Standard Sample>

Processing of the control part 112 and the operation part 111 at the time of preparing a graph on the basis of a standard sample will be described. Herein, as the sample 107 to be observed, a standard sample having a concave part whose structure is known is used. An operator inputs an input parameter via an input device such as a mouse, a controller, or a console or by using predetermined data. The input parameter is, for example, sample information, coordinate information of an image acquisition position of a sample, and coordinate information and area information of a pattern part and a periphery part for obtaining a brightness ratio. Herein, the wording "sample information" includes information (including coordinate information) of layout and a pattern (concave part, trench, or the like) of the sample 107 to be observed, information of a depth of the pattern, and information of a size and a structure (aspect ratio, and the like) of the pattern. The wording "coordinate information of an image acquisition position of a sample" means coordinate information of an image acquisition position in the sample 107 to be observed. The wording "coordinate information and area information of a pattern part and a periphery part for obtaining a brightness ratio" includes, for example, coordinate information and area information of a part of a pattern part and coordinate information and area information of a part having the lowest brightness in a periphery part of the pattern part. The input parameter is memorized in the memory device 118 via the input part 114 and is transmitted to the control part 112 and the operation part 111.

The control part 112 transmits a control signal to the electron optical system control part 115 and the high voltage power supply 116 to set an imaging condition of the SEM. With this, the electron source 103 and each part of the electron optical system described above operate based on the set imaging condition. Further, the control part 112 controls the stage control part 117 on the basis of the coordinate information of the image acquisition position of the sample. The sample stage 101 is moved in X and Y directions by control of the stage control part 117.

In the case where observation is performed in the above imaging condition, the control part 112 controls the A/D conversion part 110 and the operation part 111. With this, output from the detectors 109 and 125 is digitized by the A/D conversion part 110, and an SEM image is generated by the image acquisition part 131 of the operation part 111.

The control part 112 receives, as the input parameter, the coordinate information and the area information of the pattern part and the periphery part for obtaining the brightness ratio. The control part 112 controls the selection part 132 of the operation part 111 so as to select a pattern part and a periphery part for obtaining the brightness ratio in the SEM image on the basis of the coordinate information or the area information of the pattern part and the periphery part.

The brightness ratio calculation part 133 of the operation part 111 calculates a brightness ratio (brightness of pattern part/brightness of periphery part) of the selected parts and memorizes the calculated brightness ratio in the memory device 118. Based on the calculated brightness ratio and the sample information (depth or aspect ratio of the sample) memorized in the memory device 118, the graph preparation part 134 of the operation part 111 prepares at least one of a graph showing a relationship between the depth and the brightness ratio and a graph showing a relationship between the aspect ratio and the brightness ratio. The graph preparation part 134 of the operation part 111 memorizes the prepared graph (s) in the memory device 118. The variation calculation part 135 of the operation part 111 also calculates brightness variation of the pattern part and memorizes the brightness variation in the memory device 118. Herein, the brightness variation indicates variation of luminance of pixels corresponding to a bottom of a pattern.

The control part 112 includes a recipe preparation part 119. The recipe means a program in which an operation condition of the scanning electron microscope is recorded and is defined by a series of operation sequences including the imaging condition, the coordinate information of the image acquisition position, and the like. The recipe preparation part 119 prepares a recipe on the basis of the input parameter (the sample information, the coordinate information of the sample, and the like) and the imaging condition specified by the operator. With this, the series of the operation of the scanning electron microscope described above is automatically performed.

Example of Standard Sample

An example of a sample to be used as a standard sample will be described. FIG. 2A and FIG. 2B illustrate an example of a sample for obtaining a relationship between a depth and a brightness ratio and a relationship between an aspect ratio and the brightness ratio. Herein, a sample A having hole patterns is exemplified. FIG. 2A is a cross-sectional view of the sample A and FIG. 2B is a planar view of the sample A.

The sample A (hole) has a structure in which a plurality of oxide films 202 and wires 203 are alternately stacked, and holes 201 are laid out to the respective wires 203. The holes 201 have different depths and hole diameters. The wires 203 can be made of various materials and are herein made of, for example, two kinds of materials, i.e., metal and insulation.

Herein, the depths of the holes of the sample A are set to La1<La2<La3<La4. The hole diameters of the holes of the sample A are set to Lb1>Lb2>Lb3>Lb4>Lb5.

FIG. 3A and FIG. 3B illustrate another example of the sample for obtaining the relationship between the depth and the brightness ratio and the relationship between the aspect ratio and the brightness ratio. Herein, a sample B having trench patterns is exemplified. FIG. 3A is a cross-sectional view of the sample B and FIG. 3B is a planar view of the sample B.

The sample B (trench) has a structure in which a plurality of oxide films 302 and wires 303 are alternately stacked, and trenches 301 are laid out to the respective wires 303. The trenches 301 have different depths and groove diameters. The wires 303 can be made of various materials and are herein made of, for example, two kinds of materials, i.e., metal and insulation.

Herein, the depths of the trenches of the sample B are set to Lc1<Lc2<Lc3<Lc4. Widths of the grooves of the sample B are set to Ld1>Ld2>Ld3>Ld4>Ld5.

<Method of Calculating Brightness Ratio and Brightness Variation>

FIG. 4 illustrates an example of a method of calculating a brightness ratio and brightness variation of the sample A illustrated in FIG. 2B. However, the calculating method is not limited to this method. A single hole A 401 that the sample A (hole) has will be described as an example. An area for acquiring a brightness average and brightness variation in the hole A 401 is indicated as 402. An area for acquiring a brightness average of a part having the lowest brightness in the oxide film of the sample A is indicated as 403.

The brightness average of the hole A is defined as a value (herein, indicated as Ha) which is obtained by averaging brightness of pixels in the specified region 402. The brightness average of the darkest part in the oxide film is defined as a value (herein, indicated as Sa) which is obtained by averaging brightness of pixels in the specified region 403. By using those values, the brightness ratio (herein, indicated as Ba) of the hole A is calculated by the following equation.

$$\text{Brightness ratio } (Ba) \text{ of hole } A = \text{Brightness average } (Ha) \text{ of hole } A/\text{Brightness average } (Sa) \text{ of darkest part in oxide film} \qquad (1)$$

As an example of calculation of the brightness variation (herein, indicated as Ka) of the hole A 401, there is a method of obtaining the brightness variation by using $3\sigma$. "$\sigma$" is a standard deviation. The calculation method is not limited thereto. A coordinate of the hole A 401 is inputted as the input parameter via the input part 114 (corresponding to 1701 of FIG. 6). Further, the region 402 for acquiring the brightness average and the brightness variation and coordinate information thereof and the region 403 for acquiring the brightness average and coordinate information thereof are also inputted as the input parameters via the input part 114 (corresponding to 1703 of FIG. 6).

FIG. 4B illustrates an example of a method of calculating a brightness ratio and brightness variation of the sample B illustrated in FIG. 3B. However, the calculating method is not limited to this method. A single trench B 411 that the sample B (trench) has will be described as an example. An area for acquiring a brightness average and brightness variation in the trench B 411 is indicated as 412. An area for acquiring an average of a part having the lowest brightness in the oxide film of the sample B is indicated as 413.

The brightness average of the trench B is defined as a value (herein, indicated as Tb) which is obtained by averaging brightness of pixels in the specified region 412. The brightness average of the darkest part in the oxide film is defined as a value (herein, indicated as Sb) which is obtained by averaging brightness of pixels in the specified region 413. By using those values, the brightness ratio (herein, indicated as Bb) of the trench B is calculated by the following equation.

$$\text{Brightness ratio } (Bb) \text{ of trench } B = \text{Brightness average } (Tb) \text{ of trench } B/\text{Brightness average } (Sb) \text{ of darkest part in oxide film} \qquad (2)$$

As an example of calculation of the brightness variation (herein, indicated as Kb) of the trench B, there is a method of calculating the brightness variation by using $3\sigma$. The calculation method is not limited thereto. A coordinate of the trench B 411 is inputted as the input parameter via the input part 114 (corresponding to 1701 of FIG. 6). Further, the region 412 for acquiring the brightness average and the brightness variation and coordinate information thereof and the region 413 for acquiring the brightness average and coordinate information thereof are also inputted as the input parameters via the input part 114 (corresponding to 1703 of FIG. 6).

FIG. 5 is an explanatory view of examples of brightness variation. Herein, the description will be made by using the hole A 401 of FIG. 4A. An enlarged image of a bottom of the hole at the time of imaging the hole A 401 at an acceleration voltage A is indicated as 511. Similarly, an image obtained at an acceleration voltage B is indicated as 512, an image obtained at an acceleration voltage C is indicated as 513, an image obtained at an acceleration voltage D is indicated as 514, and an image obtained at an acceleration voltage E is indicated as 515. As illustrated in FIG. 5, brightness variation (herein, indicated as Ka) in the bottom of the hole is as follows for each of the acceleration voltages A to E.

Acceleration A: 0.82, Acceleration B: 1.25, Acceleration C: 0.53, Acceleration D: 0.28, Acceleration E: 0.19

The brightness variation Ka is calculated by, for example, a method using $3\sigma$ of luminance of the hole A 401. It is found that a condition in which the brightness variation Ka in the bottom of the hole is the largest is the acceleration voltage B. A relationship of the brightness variation Ka is acceleration B>acceleration A>acceleration C>acceleration D>acceleration E. Note that, as a method of obtaining the brightness variation, there is also a calculation method using a line profile of a hole.

<Graph Preparation Flow Using Standard Sample>

FIG. 6 shows a flow in which a relationship between a depth and a brightness ratio, a relationship between an aspect ratio and the brightness ratio, and brightness variation of a pattern part are calculated and are memorized in the memory device 118. Herein, a sample in which patterns (holes, trenches, and the like) of concave parts having a plurality of depths and sizes are laid out is used as a standard sample. Note that the depths, the sizes, and the like of the concave parts in the sample are known.

Sample information (information of layout and the patterns of the sample, information of the depths of the patterns, information of the sizes and structures of the patterns) 1701, coordinate information 1702 of an image acquisition position of the sample, and information 1703 of coordinates and areas of a pattern part and a periphery part for obtaining a brightness ratio are inputted in advance via the input part 114. The information 1701, 1702, and 1703 are memorized in the memory device 118 in advance.

The recipe preparation part 119 prepares a recipe in advance on the basis of the information 1701, 1702, and 1703 memorized in the memory device 118 and imaging conditions (hereinafter, acceleration voltages A to E) specified by an operator. The following operation is automatically performed by the control part 112 controlling the units in accordance with the recipe.

Hereinafter, the description will be made by exemplifying an acceleration condition as a measurement condition. The invention is applicable also to other measurement conditions (current, magnification, scanning method, and the like).

First, the electron optical system control part 115 selects the acceleration voltage (acceleration A to acceleration E) specified in the recipe and irradiates the sample with electron beams (601). Then, the stage control part 117 moves the sample stage 101 to an image acquisition position with the use of the sample information 1701 and the coordinate information 1702 of the memory device 118 (602).

Output from the detectors 109 and 125 is digitized by the A/D conversion part 110, and image information 611 is acquired by the image acquisition part 131 of the operation part 111 (603). The image information 611 is stored in the memory device 118.

Then, the selection part 132 of the operation part 111 selects a pattern part and a periphery part from the acquired image information 611 on the basis of the information 1703 of the coordinates and the areas of the pattern part and the periphery part for obtaining the brightness ratio (604).

Then, the brightness ratio calculation part 133 of the operation part 111 calculates a brightness ratio of the selected pattern part to the selected periphery part (605).

Then, based on the calculated brightness ratio and the sample information 1701 of the memory device 118, the graph preparation part 134 of the operation part 111 prepares a graph showing a relationship between the depth and the brightness ratio and a graph showing a relationship between an aspect ratio and the brightness ratio (606). The graphs may be prepared by approximation processing for generating a curved line or a straight line on the basis of a plurality of pieces of point group data. The prepared graphs are stored in the memory device 118 as data 612 of the depth, the aspect ratio, and the brightness ratio of the sample. Note that processing for preparing the graphs does not always need to be performed. The data 612 only needs to show the relationship between the depth and the brightness ratio and the relationship between the aspect ratio and the brightness ratio and only needs to define the brightness ratio corresponding to each depth or each aspect ratio as a numerical value.

Then, the variation calculation part 135 of the operation part 111 calculates brightness variation of the pattern part on the basis of the information 1703 of the coordinate and the area of the pattern part for obtaining the brightness ratio (607). The calculated variation is stored in the memory device 118 as brightness variation data 613 of the pattern part.

Then, whether or not the brightness ratio and the brightness variation of all the concave part patterns have been calculated is judged (608). In the case where calculation has been performed with respect to all the concave part patterns, the processing proceeds to Step 609. If not, Steps 604 to 607 are repeated.

In the case where the processing proceeds to Step 609, whether or not images have been acquired in all the concave part patterns is judged. In the case where the images have been acquired in all the concave part patterns, the processing proceeds to Step 610. If not, the processing returns to Step 603, and Steps 603 to 607 are executed for a concave part pattern whose image has not been acquired.

In the case where the processing proceeds to Step 610, whether or not images have been acquired at all the acceleration voltages (acceleration A to acceleration E) is judged. In the case where the images have been acquired at all the acceleration voltages, the processing is terminated. If not, the processing returns to Step 601, and Steps 601 to 607 are executed for an acceleration voltage at which an image has not been acquired.

It is possible to obtain an optimal measurement condition with the use of the data 612 and the data 613 obtained by the above flow.

Examples of Graphs

FIG. 7A to FIG. 7D show examples of the graphs prepared by the flow of FIG. 6. Herein, an example where the sample A (hole) of FIG. 2A and FIG. 2B is measured at the acceleration voltages A to E will be described.

FIG. 7A is a graph showing a relationship between the depth (La) and the brightness ratio (Ha/Sa) of the sample including an under layer interconnect made of metal. A horizontal axis is the depth (La) and the vertical axis is the brightness ratio (Ha/Sa). 701 is a graph obtained in the case where an image is acquired at the acceleration voltage A. Similarly, graphs obtained in the case of the acceleration voltages B to E are also shown.

Similarly, FIG. 7B is a graph showing a relationship between the aspect ratio (La/Lb) and the brightness ratio (Ha/Sa) of the sample including the under layer interconnect made of metal. FIG. 7C is a graph showing a relationship between the depth (La) and the brightness ratio (Ha/Sa) of the sample including an under layer interconnect made of insulation. FIG. 7D is a graph showing a relationship between the aspect ratio (La/Lb) and the brightness ratio (Ha/Sa) of the sample including the under layer interconnect made of insulation. Note that values of the brightness variation are also inserted in each graph (see FIG. 16C).

FIG. 8A to FIG. 8D show examples of the graphs prepared by the flow of FIG. 6. Herein, an example where the sample B (trench) of FIG. 3A and FIG. 3B is measured at the acceleration voltages A to E will be described.

FIG. 8A is a graph showing a relationship between the depth (Lc) and the brightness ratio (Tb/Sb) of the sample including an under layer interconnect made of metal. A horizontal axis is the depth (Lc) and the vertical axis is the brightness ratio (Tb/Sb). 801 is a graph obtained in the case where an image is acquired at the acceleration voltage A. Similarly, graphs obtained in the case of the acceleration voltages B to E are also shown.

Similarly, FIG. 8B is a graph showing a relationship between the aspect ratio (Lc/Ld) and the brightness ratio (Tb/Sb) of the sample including the under layer interconnect made of metal. FIG. 8C is a graph showing a relationship between the depth (Lc) and the brightness ratio (Tb/Sb) of the sample including an under layer interconnect made of insulation. FIG. 8D is a graph showing a relationship between the aspect ratio (Lc/Ld) and the brightness ratio (Tb/Sb) of the sample including the under layer interconnect made of insulation. Note that values of the brightness variation are also inserted in each graph (see FIG. 16C).

<Judgement Flow of Measurement Condition>

FIG. 9 shows a flow in which appropriateness/inappropriateness of an arbitrary measurement condition is judged with the use of the relationship between the depth and the brightness ratio, the relationship between the aspect ratio and the brightness ratio, and the brightness variation of the pattern part, which are obtained by the flow of FIG. 6, and an optimal measurement condition is obtained. Hereinafter, the description will be made by exemplifying an acceleration condition as a measurement condition. The invention is applicable also to other measurement conditions (current, magnification, scanning method, and the like). Note that, herein, a sample having a concave part pattern which is a target part to be actually observed is used as the sample 107 to be observed.

First, the electron optical system control part 115 selects an arbitrary acceleration voltage specified by an operator or a recipe (901). Then, the stage control part 117 moves the sample stage 101 to an image acquisition position specified by the operator or the recipe (902).

Then, output from the detectors 109 and 125 is digitized by the A/D conversion part 110, and image information is acquired by the image acquisition part 131 of the operation part 111 (903). The image information is displayed on the monitor 113.

Then, the operator inputs areas of a pattern part and a periphery part for obtaining a brightness ratio while watching the image information on the monitor 113. The selection part 132 of the operation part 111 receives input from the operator and selects, from the image information, the pattern part and the periphery part for obtaining the brightness ratio (904).

Then, the brightness ratio calculation part 133 of the operation part 111 calculates a brightness ratio 906 of the selected pattern part to the selected periphery part (905). The brightness ratio calculation part 133 stores the brightness ratio 906 in the memory device 118.

Then, the measurement condition determination part 136 of the operation part 111 reads, from the memory device 118, the data 612 showing a relationship between a depth or an aspect ratio and a brightness ratio of a sample having a structure which is close to a structure of the concave part pattern to be observed (907). For example, in the case where the concave part pattern to be observed is a hole and the under layer interconnect is made of metal, the graph of FIG. 7A or FIG. 7B is read.

Then, the measurement condition determination part 136 of the operation part 111 obtains a depth of the concave part pattern corresponding to the brightness ratio 906 with the use of the brightness ratio 906 and the read data 612 (908). Thus, it is possible to calculate the structure of the concave part which is the target part to be actually observed on the basis of the data 612 memorized in advance.

Then, regarding the calculated depth, the measurement condition determination part 136 of the operation part 111 calculates the lowest acceleration voltage which achieves the brightness ratio of 1 or more, i.e., which enables observation (909). Herein, the reason why judgement is performed with a threshold of the brightness ratio of 1 is as follows: the brightness ratio of 1 or more indicates that the pattern part is brighter than the periphery part (that is, an SEM signal of the pattern part is obtained), and the graph showing the relationship between the depth and the brightness ratio of the sample and the graph showing the relationship between the aspect ratio and the brightness ratio (FIG. 7A to FIG. 7D, FIG. 8A to FIG. 8D) have a proportional relationship in regions having the brightness ratio of 1 or more. The threshold is an example, and the threshold only needs to be defined within a range within which the relationship between the depth and the brightness ratio or the relationship between the aspect ratio and the brightness ratio is determined to be linear. Further, a different threshold may be set for each measurement condition (current, magnification, scanning method, or the like).

Then, the measurement condition determination part 136 of the operation part 111 judges whether or not the arbitrary acceleration voltage specified in Step 901 is appropriate (910). In the case where, for example, observation is actually performed at an acceleration voltage equal to or larger than the lowest acceleration voltage obtained in Step 909 and there is no other acceleration voltages satisfying the lowest acceleration voltage or more, the measurement condition determination part 136 judges that the arbitrary acceleration voltage is appropriate. This case is, for example, a case where observation is performed at the acceleration A in FIG. 12B, which will be described in detail below. In this case, the processing proceeds to start of actual measurement (YES in 910). Meanwhile, in the case where the arbitrary acceleration voltage is inappropriate but there is only one acceleration voltage satisfying the lowest acceleration voltage or more (that is, in the case where there is only one candidate of the optimal measurement condition), the acceleration voltage is outputted and the processing proceeds to the start of the actual measurement (YES in 910). In other cases (that is, a case where the arbitrary acceleration voltage is inappropriate and there are a plurality of candidates of the optimal acceleration voltage satisfying the lowest acceleration voltage or more), the processing proceeds to 911 (NO in 910).

In the case where the processing proceeds to Step 910, the measurement condition determination part 136 of the operation part 111 reads, from the memory device 118, the brightness variation data 613 of a pattern part of a sample having a structure which is close to the structure of the concave part pattern to be observed (911). Then, the measurement condition determination part 136 of the operation part 111 outputs an acceleration condition in which the acceleration voltage is equal to or larger than the lowest acceleration voltage calculated in Step 909 and brightness variation is the largest (912). This condition is the optimal acceleration condition, and it is possible to start measurement with the use of this acceleration condition. Herein, the reason why the acceleration condition in which a value of the brightness variation is the largest is selected is that it is considered that the bottom of the pattern can be observed more satisfactorily as the brightness variation is increased. For example, as illustrated in FIG. 5, the image at the acceleration B at which the brightness variation is the largest satisfactorily shows the structure of the bottom of the hole.

Note that, in Step 912, the measurement condition determination part 136 is not limited to output a single acceleration condition, and the measurement condition determination part 136 may output a plurality of acceleration conditions as candidates. For example, the measurement condition determination part 136 may output several acceleration conditions in which the acceleration voltages are equal to or larger than the lowest acceleration voltage in order from the largest brightness variation and may cause the operator to select one.

Calculation Example of Optimal Acceleration Condition

FIG. 10A and FIG. 10B illustrate an example of calculation of the optimal acceleration condition described in the flow of FIG. 9. FIG. 10A and FIG. 10B illustrate an example of a hole sample (Hole 1) having a lower layer structure made of a metal material. FIG. 10A illustrates an image obtained by observing the hole sample (Hole 1) at the acceleration voltage A (observation condition is arbitrary). 1001 indicates an area for acquiring a brightness average of a hole, and 1002 indicates an area for acquiring a brightness average of a periphery part. Those areas can be arbitrarily specified by an operator or the recipe preparation part 119 of the control part 112. Note that a single area of a hole and a single area of a periphery part may be specified or a plurality of areas of holes and a plurality of areas of periphery parts may be specified.

An average of brightness of pixels in the specified area 1001 is defined as a brightness average (herein, indicated as H1) of the hole, and an average of brightness of pixels in the specified area 1002 is defined as a brightness average (herein, indicated as S1) of the periphery part. A brightness ratio (herein, indicated as B1) 1003 of the hole sample (Hole 1) is calculated based on those values by the following equation.

$$\text{Brightness ratio } (B1) \text{ 1003 of Hole 1} = \text{Brightness average } (H1) \text{ of hole/Brightness average } (S1) \text{ of periphery part} \quad (3)$$

FIG. 10B is a graph of a sample having a structure which is close to a structure of FIG. 10A and is a graph showing a relationship between a depth and a brightness ratio acquired in the case where the sample includes an under layer interconnect made of metal. The graph of FIG. 10B corresponds to the graph of FIG. 7A. The graph of FIG. 7A is a graph prepared by the flow of FIG. 6.

In this example, the hole sample (Hole 1) is observed in an arbitrary condition: the acceleration voltage A, and therefore a graph 1008 at the acceleration voltage A is seen. A point in the graph 1008 at the acceleration voltage A, which corresponds to the calculated brightness ratio B1 1003, is 1004. A position of the depth intersecting with a line 1005 obtained by vertically extending the point 1004 is a value 1006 of a depth of the Hole 1. As shown in the flowchart of FIG. 9, the lowest acceleration condition to enable observation is determined based on whether or not the brightness ratio is 1 or more. Therefore, the hole sample (Hole 1) of FIG. 10A can be observed at the acceleration voltages A, B, C, and D.

The brightness variation of the hole of the sample corresponding to FIG. 7A is acceleration D> acceleration C> acceleration B> acceleration A. That is, it is possible to determine that, in the case where, for example, the hole has a concave and convex bottom or there is a residue in the bottom of the hole, the concavity and convexity and the residue can be observed most clearly at the acceleration D. Therefore, an optimal acceleration condition for observing the hole sample (Hole 1) of FIG. 10A is the acceleration voltage D.

FIG. 11A and FIG. 11B illustrate an example of calculation of the optimal acceleration condition described in the flow of FIG. 9. FIG. 11A and FIG. 11B illustrate an example of a hole sample (Hole 2) having a lower layer structure made of an insulation material. FIG. 11A illustrates an image obtained by observing the hole sample (Hole 2) at the acceleration voltage D (observation condition is arbitrary). 1101 indicates an area for acquiring a brightness average of a hole, and 1102 indicates an area for acquiring a brightness average of a periphery part. Those areas can be arbitrarily specified by an operator or the recipe preparation part 119 of the control part 112. Note that a single area of a hole and a single area of a periphery part may be specified or a plurality of areas of holes and a plurality of areas of periphery parts may be specified.

An average of brightness of pixels in the specified area 1101 is defined as a brightness average (herein, indicated as H2) of the hole, and an average of brightness of pixels in the specified area 1102 is defined as a brightness average (herein, indicated as S2) of the periphery part. A brightness ratio (herein, indicated as B2) 1.103 of the hole sample (Hole 2) is calculated based on those values by the following equation.

$$\text{Brightness ratio } (B2) \text{ 1103 of Hole 2} = \text{Brightness average } (H2) \text{ of hole/Brightness average } (S2) \text{ of periphery part} \quad (4)$$

FIG. 11B is a graph of a sample having a structure which is close to a structure of FIG. 11A and is a graph showing a relationship between a depth and a brightness ratio acquired in the case where the sample includes an under layer interconnect made of insulation. The graph of FIG. 11B corresponds to the graph of FIG. 7C. The graph of FIG. 7C is a graph prepared by the flow of FIG. 6.

In this example, the hole sample (Hole 2) is observed in an arbitrary observation condition: the acceleration voltage D, and therefore a graph 1108 at the acceleration voltage D is seen. A point in the graph 1108 at the acceleration voltage D, which corresponds to the calculated brightness ratio B2 1103, is 1104. A position of the depth intersecting with a line 1105 obtained by vertically extending the point 1104 is a value 1106 of a depth of the Hole 2. As shown in the flowchart of FIG. 9, the lowest acceleration condition to enable observation is determined based on whether or not the brightness ratio is 1 or more. Therefore, the hole sample (Hole 2) of FIG. 11A can be observed at the acceleration voltages A, B, and C.

The brightness variation of the hole of the sample corresponding to FIG. 7C is acceleration B> acceleration C> acceleration A. Therefore, it is possible to determine that, in the case where, for example, the hole has a concave and convex bottom or there is a residue in the bottom of the hole, the concavity and convexity and the residue can be observed most clearly at the acceleration B. Therefore, an optimal acceleration condition for observing the hole sample (Hole 2) of FIG. 11A is the acceleration voltage B.

FIG. 12A and FIG. 12B illustrate an example of calculation of the optimal acceleration condition described in the flow of FIG. 9. FIG. 12A and FIG. 12B illustrate an example of a trench sample (Trench 1) having a lower layer structure made of an insulation material. FIG. 12A illustrates an image obtained by observing the trench sample (Trench 1) at the acceleration voltage B (observation condition is arbitrary). 1201 indicates an area for acquiring a brightness average of a trench, and 1202 indicates an area for acquiring a brightness average of a periphery part. Those areas can be arbitrarily specified by an operator or the recipe preparation part 119 of the control part 112. Note that a single area of a trench and a single area of a periphery part may be specified or a plurality of areas of trenches and a plurality of areas of periphery parts may be specified.

An average of brightness of pixels in the specified area 1201 is defined as a brightness average (herein, indicated as T3) of the trench, and an average of brightness of pixels in the specified area 1202 is defined as a brightness average (herein, indicated as S3) of the periphery part. A brightness ratio (herein, indicated as B3) 1203 of the trench sample (Trench 1) is calculated based on those values by the following equation.

Brightness ratio (*B*3) 1203 of Trench 1=Brightness average (*T*3) of trench/Brightness average (*S*3) of periphery part     (5)

FIG. 12B is a graph of a sample having a structure which is close to a structure of FIG. 12A and is a graph showing a relationship between a depth and a brightness ratio acquired in the case where the sample includes an under layer interconnect made of insulation. The graph of FIG. 12B corresponds to the graph of FIG. 8C. The graph of FIG. 8C is a graph prepared by the flow of FIG. 6.

In this example, the trench sample (Trench 1) is observed in an arbitrary observation condition: the acceleration voltage B, and therefore a graph 1208 at the acceleration voltage B is seen. A point in the graph 1208 at the acceleration voltage B, which corresponds to the calculated brightness ratio *B*3 1203, is 1204. A position of the depth intersecting with a line 1205 obtained by vertically extending the point 1204 is a value 1206 of a depth of the Trench 1. As shown in the flowchart of FIG. 9, the lowest acceleration condition to enable observation is determined based on whether or not the brightness ratio is 1 or more. Therefore, the trench sample (Trench 1) of FIG. 12A can be observed at the acceleration voltage A. In the acceleration conditions exemplified herein, the acceleration voltage A is the highest acceleration condition, and therefore an optimal acceleration condition for observing the trench sample (Trench 1) of FIG. 12A is the acceleration voltage A.

In the examples illustrated in FIGS. 10A, 10B, 11A, 11B, 12A, and 12B, the description has been made by exemplifying the acceleration condition as the measurement condition. However, it is possible to similarly calculate an optimal condition in other measurement conditions (current, magnification, scanning method, and the like). Further, in the examples of FIGS. 10A, 10B, 11A, 11B, 12A, and 12B, the graph showing the relationship between the depth and the brightness ratio is used. However, also in the case of a graph showing a relationship between an aspect ratio and a brightness ratio, it is possible to determine an optimal measurement condition with a similar method.

As described above, according to this example, it is possible to easily judge appropriateness/inappropriateness of an arbitrary measurement condition by using the relationship between the depth or the aspect ratio of the sample and the brightness ratio. Further, in the case where the arbitrary measurement condition is inappropriate, it is possible to determine an optimal measurement condition. With this configuration, a time required for determining an optimal measurement condition is reduced, and variation caused by human factors can be also reduced.

Example 2

Hereinafter, an embodiment of this example will be described with reference to drawings. This example is a technology for checking a device state as a prerequisite for accurately obtaining an optimal measurement condition in Example 1.

<Device State Checking Sample>

FIG. 13A is a planar view of the sample stage 101 for use in this example. A device state checking sample 108 for checking a device state is placed on the sample stage 101. A part where the sample 108 is placed is not limited to a position illustrated in FIG. 13A.

In this example, a standard sample having a concave part (hole, trench, or the like) whose structure is known is used as the sample 108. The sample 108 has concave part patterns (holes, trenches, or the like) having a plurality of different depths and a plurality of different sizes as illustrated in FIGS. 2A, 2B, 3A, and 3B. FIG. 13B is an example of the sample 108. In this example, the sample A (hole) including the under layer interconnect made of metal, which is illustrated in FIGS. 2A and 2B, is used as the sample 108.

A pattern 1301 used for checking a device state is determined in the sample 108. In this example, the device state is managed by observing the determined pattern 1301 in the same measurement condition every time to check a brightness ratio.

<Judgement of Device State>

Herein, observation is assumed to be performed in the acceleration condition A. FIG. 13C shows a graph showing a relationship between a depth and a brightness ratio at the acceleration voltage A. FIG. 13C shows only the graph at the acceleration voltage A, which is extracted from FIG. 7A. This graph is prepared by the flow of FIG. 6.

In a graph 1305, a device stability range 1302 is set. For example, an operator inputs the device stability range 1302 via the input part 114, and the inputted device stability range 1302 is stored in the memory device 118. For example, the device stability range 1302 may be set to a range within several percentages below or above the graph. In the case where the device is stable, a numerical value falls within the device stability range 1302 as indicated as 1303, and, in the case where the device is unstable, the numerical value is out of the device stability range 1302 as indicated as 1304.

<Flow for Checking Device State>

FIG. 14 shows a flow in which a device state is checked. The sample information (the information of the layout and the pattern of the sample, the information of the depth of the pattern, the information of the size and the structure of the pattern) 1701, coordinate information 1704 of an image acquisition position for checking the device state, information 1705 of coordinates and areas of a pattern part and a periphery part (part having the lowest brightness) for obtaining a brightness ratio of the pattern used for checking the device state, and device stability range data 1706 are inputted in advance via the input part 114. The information 1701, 1704, 1705, and 1706 are memorized in the memory device 118 in advance.

The recipe preparation part 119 prepares a recipe in advance on the basis of the information 1701, 1704, 1705, and 1706 memorized in the memory device 118 and an imaging condition specified by an operator. The following operation is automatically performed by the control part 112 controlling the units in accordance with the recipe.

Hereinafter, the description will be made by exemplifying an acceleration condition as a measurement condition. This example is applicable also to other measurement conditions (current, magnification, scanning method, and the like).

First, the electron optical system control part 115 sets an acceleration voltage specified in the recipe (1401). Then, the stage control part 117 moves the sample stage 101 to an image acquisition position (that is, an image acquisition position of the sample 108) with the use of the sample information 1701 and the coordinate information 1704 of the memory device 118 (1402).

Then, output from the detectors 109 and 125, which has been obtained by irradiation with electron beams, is digitized by the A/D conversion part 110, and image information 1410 is acquired by the image acquisition part 131 of the operation part 111 (1403). The image information 1410 is stored in the memory device 118.

Then, the selection part 132 of the operation part 111 selects a pattern part and a periphery part from the acquired image information 1410 on the basis of the information 1705 of the coordinates and the areas of the pattern part and the periphery part for obtaining the brightness ratio (1404).

Then, the brightness ratio calculation part 133 of the operation part 111 calculates a brightness ratio of the selected pattern part to the selected periphery part (1405).

Then, the device state judgment part 137 of the operation part 11 extracts, from the data 612, a preexisting graph showing a relationship between a depth and a brightness ratio on the basis of the sample information 1701 and the specified acceleration voltage. Thereafter, the device state judgment part 137 of the operation part 111 compares a relationship between a depth and the brightness ratio obtained this time with the preexisting relationship between the depth and the brightness ratio (1406). At this time, the device state judgment part 137 judges whether or not the relationship between the depth and the brightness ratio obtained this time falls within the device stability range with the use of the device stability range data 1706 (1407).

In the case where the device state judgment part 137 of the operation part 111 judges that the relationship between the depth and the brightness ratio obtained this time falls within the device stability range of the preexisting data (1407), the processing proceeds to Step 1408. If not, the device state judgment part 137 performs display showing that the device state is unstable on the monitor 113. With this, the operator knows that the device state is unstable. Thereafter, adjustment and maintenance of the device are performed (1409). After the adjustment and the maintenance of the device, the flow is executed again from Step 1401 and the device state is checked.

In the case where the processing proceeds to Step 1408, whether or not another observation pattern exists is judged, and, in the case where another pattern to be observed exists, a similar flow is executed from Step 1402. In the case where there is no other observation pattern (1408), it means that the device state is judged to be stable in all the observation patterns. Therefore, it is determined that the device state is stable, and the processing is terminated. Note that, whether or not the device state is stable can be judged more accurately by specifying a plurality of observation patterns.

According to this example, the device state can be checked by regularly observing the sample 108 for checking the device state to calculate the brightness ratio and comparing the brightness ratio with the preexisting data. Therefore, the device state is checked as the prerequisite for accurately obtaining the optimal measurement condition of Example 1, resulting in improvement of judgement accuracy of the optimal measurement condition. It is also possible to detect abnormality of the device and perform maintenance and the like.

<Screen Configuration>

FIGS. 15A, 15B, 15C, 15D, 16A, 16B, and 16C illustrate a screen configuration displayed on the monitor 113. FIG. 15A illustrates an entire configuration of a screen displayed on the monitor 113.

A screen 1501 includes an irradiation condition selection tab 1502 and an observation condition analysis tab 1503. The screen 1501 further includes an input button 1504 for inputting various kinds of data.

The screen 1501 further includes a map display part 1506, a graph display part 1507, a brightness display part 1508, and a measurement condition display part 1509. A sample observation image display part 1505 is a part where image information of a sample is displayed. The map display part 1506 is a part where a map and the like of the sample are displayed. The graph display part 1507 is a part where a graph showing a relationship between a depth or an aspect ratio and a brightness ratio is displayed. The brightness display part 1508 is a part where the brightness and the like calculated in the flows of FIG. 9 and FIG. 14 are displayed. The measurement condition display part 1509 is a part where the optimal measurement condition determined in the flow of FIG. 9 is displayed.

FIG. 15B is an enlarged view of the irradiation condition selection tab 1502. The irradiation condition selection tab 1502 includes a box 1510 from which an acceleration voltage can be selected and a box 1511 from which a current can be selected. The irradiation condition selection tab 1502 may include a box from which other measurement conditions (magnification, scanning method, and the like) for acquiring an image can be selected.

FIG. 15C is an enlarged view of the observation condition analysis tab 1503. A function of the observation condition analysis tab 1503 is mainly used in the flow of FIG. 9. A function of inputting a coordinate will be described. The observation condition analysis tab 1503 includes a coordinate input button 1512, a move button 1513, and a memory button 1514. An operator can input an arbitrary coordinate by pushing the coordinate input button 1512. Movement to a position of the inputted coordinate can be performed by pushing the move button 1513. The position of the inputted coordinate can be memorized in the memory device 118 by pushing the memory button 1514.

Then, functions of acquiring an image and selecting a graph will be described. The observation condition analysis tab 1503 includes an image acquisition button 1515 and a graph selection box 1516. Image information displayed on the sample observation image display part 1505 can be stored in the memory device 118 by pushing the image acquisition button 1515. Note that, by storing the image information in the memory device 118 once, it is also possible to read the image information from the memory device 118 with the use of the image acquisition button 1515 and display the image information on the sample observation image display part 1505.

The graph showing the relationship between the depth or the aspect ratio and the brightness ratio (or a numerical value or the like in the case where the graph is not prepared), which is prepared in the flow of FIG. 6, can be selected with the use of the graph selection box 1516. With this, in the case where appropriateness/inappropriateness of a measurement condition is judged, it is possible to read, from the memory device 118, the data 612 showing a relationship between a depth or an aspect ratio and a brightness ratio of a sample having a structure which is close to a structure of a concave part pattern to be observed. The graph selected herein is displayed on the graph display part 1507.

A function of selecting a pattern part and a periphery part will be described. The observation condition analysis tab 1503 includes a pattern part selection button 1517, a periphery part selection button 1518, a rectangular button 1519, a circular button 1520, and a delete button 1521. The pattern part selection button 1517 is used for specifying an area for obtaining brightness of the pattern part. In the case where the pattern part selection button 1517 is pushed and the rectangular button 1519 is pushed, a rectangular frame whose size is arbitrarily changeable is displayed on an image in the sample observation image display part 1505 (e.g., 1201 of FIG. 12A). Note that, in the case where the rectangular button 1519 is pushed once, a single rectangular frame is displayed, whereas, in the case where the rectangular button 1519 is pushed a plurality of times, frames corresponding to the plurality of times are displayed.

In the case where the pattern part selection button 1517 is pushed and the circular button 1520 is pushed, a circular frame whose size is arbitrarily changeable is displayed on the image in the sample observation image display part 1505 (e.g., 1001 of FIG. 10A). Herein, although a rectangular shape and a circular shape have been exemplified, the area may be specified by using other polygonal or arbitrary shapes.

The periphery part selection button 1518 is used for specifying an area for obtaining brightness of the periphery part. A using method thereof is similar to that of the pattern part selection button 1517. Note that, in the case where a rectangle or a circle displayed on the image is selected and the delete button 1521 is pushed, an area of the rectangle or circle can be deleted from the image.

The observation condition analysis tab 1503 includes a brightness display button 1522. In the case where the brightness display button 1522 is pushed, the calculated brightness or the like is displayed on the brightness display part 1508. FIG. 15D is an enlarged view of the brightness display part 1508. A brightness average 1525 of the pattern part, a brightness average 1526 of the periphery part, a value 1527 of a brightness ratio, and brightness variation 1528 are displayed on the brightness display part 1508.

The observation condition analysis tab 1503 further includes a condition button 1523 and a setting button 1524. In the case where the condition button 1523 is pushed, the optimal measurement condition obtained in the flow of FIG. 9 is displayed on the measurement condition display part 1509. In the case where the setting button 1524 is pushed, a condition is switched to the optimal condition displayed on the measurement condition display part 1509.

FIG. 16A illustrates an example of the image information displayed on the sample observation image display part 1505. Acquired image information 1601 is displayed on the sample observation image display part 1505. Circular and rectangular frames 1602, which have been specified with the use of the buttons 1517, 1518, 1519, and 1520, are displayed on the image information 1601.

FIG. 16B illustrates an example of the map (sample) displayed on the map display part 1506. Because a map 1603 of a sample is displayed on the map display part 1506, an observed position 1610 can be found. By specifying an area as indicated as 1604 by, for example, drag using a mouse or the like, it is possible to increase or reduce the area. Although a case of a wafer has been described in this example, it is possible to display a map of a sample on the map display part 1506, regardless of a size and the kind of the sample.

FIG. 16C illustrates an example of the graph displayed on the graph display part 1507. The graph display part 1507 displays the graph read in Step 907 of FIG. 9. This graph is the graph prepared in the flow of FIG. 6. This example is assumed to perform observation at the acceleration voltage A (observation condition is arbitrary) in the flow of FIG. 9.

In the case where the brightness display button 1522 is pushed, the value 1527 of the brightness ratio calculated in Step 905 of FIG. 9 is displayed on the graph and a point 1607 corresponding to the value 1527 of the brightness ratio is plotted on a graph 1605 at the acceleration voltage A. Further, a line 1611 extended in a vertical direction from the point 1607 is displayed and a value 1608 of a depth corresponding to the line 1611 is displayed. Further, a line is displayed in a horizontal direction from a position 1609 of the brightness ratio of 1.

When a plot 1612 on the graph 1605 is clicked, a value 1613 of brightness variation acquired when the graph is prepared is displayed. In this example, the brightness variation of all the graphs acquired in the flow of FIG. 6 can be displayed on the corresponding graphs of the graph display part 1507.

Note that the graph of FIG. 16C may be displayed on the graph display part 1507 before the flow of FIG. 9 is executed. By displaying the graph of FIG. 16C alone, an operator can also determine an optimal measurement condition without executing the flow of FIG. 9. In order to check the device state, it is also possible to display the graph of FIG. 13C on the graph display part 1507.

Note that, although a case where the screen is used in the flow of FIG. 9 has been described in the above description, a screen to be used in the case where the flow of FIG. 6 or FIG. 14 is executed can be mounted with a similar configuration.

FIG. 17A illustrates an example of a window opened when the input button 1504 is pushed. A window 1726 opened when the input button 1504 is pushed is in folder form, and, in the case where various kinds of data are inputted to the window 1726, the data is inputted to the input part 114.

The window 1726 can store the data described in the flows of FIG. 6, FIG. 9, and FIG. 14. An example of the various kinds of data will be described below. Note that the data described herein is an example and is not limited thereto.

FIG. 17B illustrates an example of data content of the sample information 1701. The sample information 1701 includes, as data, a shot arrangement 1707, a die arrangement 1708, a die origin coordinate 1709, an alignment coordinate 1710, a structure 1725 of a sample, a coordinate 1722 from the die origin coordinate 1709 to a pattern part, a depth (thickness) 1723 of a pattern, and a size 1724 of the pattern.

FIG. 17C illustrates an example of the coordinate information 1702 of the image acquisition position of the sample. The coordinate information 1702 of the image acquisition position of the sample includes coordinate information 1711 from the die origin coordinate 1709 to the image acquisition position.

FIG. 17D illustrates an example of the information 1703 of the coordinates and the areas of the pattern part and the periphery part for obtaining the brightness ratio. The information 1703 includes a coordinate 1712 from the die origin coordinate 1709 to the pattern part, an area 1718 for obtaining brightness in the pattern part, a coordinate 1713 from the die origin coordinate 1709 to the periphery part (darkest part), and an area 1719 for obtaining brightness in the periphery part.

FIG. 17E illustrates an example of the coordinate information 1704 of the image acquisition position for checking the device state. The coordinate information 1704 includes a coordinate 1714 from the die origin coordinate 1709 to the image acquisition position for checking the device state.

FIG. 17F illustrates an example of the information 1705 of the coordinates and the areas of the pattern part and the periphery part for obtaining the brightness ratio of the pattern used for checking the device state. The information 1705 includes a coordinate 1715 from the die origin coordinate 1709 to the pattern part for checking the device state, an area 1720 for obtaining brightness in the pattern part for checking the device state, a coordinate 1716 from the die origin coordinate 1709 to the periphery part (part having the lowest brightness) for checking the device state, and an area 1721 for obtaining brightness in the periphery part for checking the device state. FIG. 17G illustrates an example of the device stability range data 1706. The device stability range data 1706 includes device stability range data 1717.

According to the above screen configuration, an operator can arbitrarily set a measurement condition on the screen and check an optimal measurement condition while checking various kinds of information.

Note that the invention is not limited to the above examples and includes various modification examples. For example, the above examples have been described in detail to easily understand the invention, and therefore the invention is not necessarily limited to the examples having all the configurations described above. Further, a part of a configuration of a certain example can be replaced with a configuration of another example, and a configuration of another example can be added to a configuration of a certain example. Further, another configuration can be added to, removed from, or replaced with a part of the configuration of each example.

For example, in terms of automatically judging appropriateness/inappropriateness of an arbitrary measurement condition, not all of the processing of FIG. 9 is necessary, and the invention may be configured by Steps 901 to 910. In this case, the operation part 111 may automatically output a measurement condition to be set next and repeat observation. For example, in the case where the acceleration voltage (first acceleration voltage) is judged to be inappropriate in Step 910, a second acceleration voltage which is higher than the arbitrary acceleration voltage may be set and the processing of Steps 901 to 910 may be repeated again. With this, an operator can judge an optimal measurement condition while watching an image on the monitor 113 during a period in which the processing is repeated.

In terms of assisting determination of an optimal measurement condition, the electron microscope only needs to include at least the monitor (display part) 113 for displaying the information indicating the relationship between the depth or the aspect ratio and the brightness ratio memorized in the memory device 118 and the input part 114 for changing a measurement condition. In this case, an operator can determine an optimal measurement condition by referring to a graph and the like on the monitor 113 without executing the processing of FIG. 9. Note that, in the case where brightness variation is also simultaneously displayed on the monitor 113, it is possible to further reduce a time required for determining a measurement condition.

As described above, the configurations of the examples can be realized by hardware by, for example, designing a part or all thereof with an integrated circuit. Further, the invention may be realized by a program code of software that realizes functions of the examples. In this case, a non-transitory computer readable medium on which the program code is recorded is provided to an information processing apparatus (computer) and the information processing apparatus (or CPU) reads the program code stored in the non-transitory computer readable medium. Examples of the non-transitory computer readable medium encompass a flexible disk, a CD-ROM, a DVD-ROM, a hard disk, an optical disk, a magneto-optical disk, a CD-R, a magnetic tape, a non-volatile memory card, and a ROM.

Further, the program code may be supplied to an information processing device by various types of transitory computer readable media. Examples of the transitory computer readable medium encompass an electrical signal, an optical signal, and an electromagnetic wave. The transitory computer readable medium can supply a program to an information processing device via a wired communication path such as an electrical line or an optical fiber or a wireless communication path.

Control lines and information lines in the drawings, which are considered to be needed for the description, are shown and not all control lines and information lines are necessarily shown in terms of a product. All the configurations may be connected to one another.

REFERENCE SIGNS LIST

101: sample stage
102: imaging device
103: electron source
104: condenser lens
105: deflection coil
106: objective lens
107: sample to be observed
108: device state checking sample
109: detector
110: A/D conversion part
111: operation part
112: control part
113: monitor
114: input part
115: electron optical system control part
116: high voltage power supply
117: stage control part
118: memory device
119: recipe preparation part
131: image acquisition part
132: selection part
133: brightness ratio calculation part
134: graph preparation part
135: variation calculation part
136: measurement condition determination part
137: device state judgment part
611: image information
612: data of depth, aspect ratio, and brightness ratio of sample
613: brightness variation data of pattern part
906: brightness ratio
1410: image information
1701: sample information
1702: coordinate information of image acquisition position of sample
1703: information of coordinates and areas of pattern part and periphery part for obtaining brightness ratio
1704: coordinate information of image acquisition position for checking device state
1705: information of coordinates and areas of pattern part and periphery part for obtaining a brightness ratio of a pattern used for checking device state
1706: device stability range data

The invention claimed is:
1. A sample observation device, comprising:
a charged particle optical column configured to irradiate a sample with a charged particle beam at a first acceleration voltage, the sample having a target part to be observed which is a concave part;
a detector configured to detect charged particles obtained by irradiation with the charged particle beam;
an imaging system in communication with the detector, the imaging system being configured to form an image including the target part to be observed on the basis of an output of the detector and to extract brightness information of the concave part and a periphery part of the concave part from the formed image;

a controller in communication with the imaging system, the controller having a memory configured to store in advance, at each of a plurality of acceleration voltages, information indicating a relationship between a brightness ratio of the concave part to the periphery part of the concave part in a standard sample and a value indicating at least one of depth and aspect ratio of the concave part in the standard sample; and a processor configured to: i) calculate the brightness ratio of the concave part and the periphery part based on the extracted brightness information, ii) compare the calculated brightness ratio with a brightness ratio stored in the memory, iii) select an acceleration voltage stored in association with the brightness ratio stored in the memory, and iv) generate a control signal that changes the acceleration voltage applied to the charged particle beam.

2. The sample observation device according to claim 1, wherein the processor obtains a value indicating the first acceleration voltage by judging whether or not the brightness ratio in the image is equal to or larger than a value determined in advance in a relationship corresponding to the first acceleration voltage in the information indicating the relationship.

3. The sample observation device according to claim 2, wherein the value determined in advance is 1.

4. The sample observation device according to claim 2, wherein the value determined in advance defines a range within which the relationship can be determined to be linear.

5. The sample observation device according to claim 2, wherein the processor obtains the lowest acceleration voltage satisfying the judgement from the plurality of acceleration voltages.

6. The sample observation device according to claim 2, wherein, in the case where the brightness ratio in the image is larger than the value determined in advance, the processor
sets a second acceleration voltage which is higher than the first acceleration voltage and acquires a second image, and
obtains the value indicating the structure of the second acceleration voltage with the use of the information indicating the relationship and a brightness ratio in the second image.

7. The sample observation device according to claim 2, wherein:
the memory further stores information of brightness variation of the concave part in the standard sample; and
in the case where the brightness ratio in the image is larger than the value determined in advance, the processor determines at least one acceleration voltage configured to observe the target part to be observed among the plurality of acceleration voltages with the use of the information of the brightness variation.

8. The sample observation device according to claim 7, wherein the processor determines a single acceleration voltage by obtaining an acceleration voltage having the largest brightness variation from the plurality of acceleration voltages.

9. The sample observation device according to claim 1, the value indicating the structure of the concave part in the standard sample is a depth of the concave part or an aspect ratio of the concave part.

10. The sample observation device according to claim 1, further comprising
a display part configured to display the information indicating the relationship as a graph.

11. The sample observation device according to claim 1, wherein:
the standard sample has a plurality of concave parts having different structures; and
the processor prepares the information indicating the relationship on the basis of images obtained by irradiating the plurality of concave parts of the standard sample with the charged particle beams at each of the plurality of acceleration voltages.

12. The sample observation device according to claim 1, wherein:
the memory stores the information indicating the relationship for each of a plurality of measurement conditions in advance;
the processor obtains a predetermined measurement condition with the use of the information indicating the relationship and the brightness ratio in the image; and
the measurement condition is at least one of a current, a magnification, and a scanning method.

13. A sample observation device, comprising:
a charged particle optical column configured to irradiate a sample with a charged particle beam at a first acceleration voltage, the sample having a target part to be observed which is a concave part;
a detector configured to detect charged particles obtained by irradiation with the charged particle beam;
an imaging system in communication with the detector, the imaging system being configured to form an image including the target part to be observed on the basis of an output of the detector and to extract brightness information of the concave part and a periphery part of the concave part from the formed image;
an input device configured to input acceleration voltage information of the charged particle beam;
a controller in communication with the imaging system, the controller having a processor;
a memory configured to store in advance, at each of a plurality of acceleration voltages, information indicating a relationship between the brightness ratio of the concave part to the periphery part of the concave part in a standard sample and a value indicating at least one depth and aspect ratio of the concave part in the standard sample, wherein
the processor is configured to: i) calculate the brightness ratio of the concave part and the periphery part based on the extracted brightness information, ii) compare the calculated brightness ratio with a brightness ratio stored in the memory, iii) select an acceleration voltage stored in association with the brightness ratio stored in the memory, and iv) generate a control signal that changes the acceleration voltage applied to the charged particle beam; and
a display in communication with the imaging system and the controller, the display being configured to display the information indicating the relationship for each acceleration voltage.

* * * * *